US012363962B2

(12) United States Patent
Lin et al.

(10) Patent No.: US 12,363,962 B2
(45) Date of Patent: Jul. 15, 2025

(54) ISOLATION STRUCTURES OF SEMICONDUCTOR DEVICES

(71) Applicant: Taiwan Semiconductor Manufacturing Company, Ltd., Hsinchu (TW)

(72) Inventors: Pinyen Lin, Rochester, NY (US); Chin-Hsiang Lin, Hsinchu (TW); Huang-Lin Chao, Hillsboro, OR (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 203 days.

(21) Appl. No.: 17/459,476

(22) Filed: Aug. 27, 2021

(65) Prior Publication Data

US 2023/0065234 A1  Mar. 2, 2023

(51) Int. Cl.
| | |
|---|---|
| *H10D 62/10* | (2025.01) |
| *H01L 21/3105* | (2006.01) |
| *H01L 21/3115* | (2006.01) |
| *H01L 21/762* | (2006.01) |
| *H10D 30/01* | (2025.01) |
| *H10D 30/62* | (2025.01) |

(52) U.S. Cl.
CPC ..... *H10D 62/115* (2025.01); *H01L 21/31051* (2013.01); *H01L 21/31155* (2013.01); *H01L 21/76224* (2013.01); *H10D 30/024* (2025.01); *H10D 30/6211* (2025.01)

(58) Field of Classification Search
CPC ........... H01L 29/0649; H01L 21/31051; H01L 21/31155; H01L 21/76224; H01L 29/66795; H01L 29/7851
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,786,542 B2 * | 10/2017 | Chuang | H01L 29/0642 |
| 9,831,183 B2 | 11/2017 | Lin et al. | |
| 9,859,386 B2 | 1/2018 | Ho et al. | |
| 2009/0104789 A1 * | 4/2009 | Mallick | H01L 21/02337 |
| | | | 257/E21.24 |
| 2011/0151678 A1 * | 6/2011 | Ashtiani | H01L 21/02274 |
| | | | 257/E21.24 |
| 2020/0020782 A1 * | 1/2020 | Ching | H01L 21/76224 |
| 2021/0217887 A1 * | 7/2021 | Shu | H01L 29/66795 |

* cited by examiner

*Primary Examiner* — Jay C Kim
*Assistant Examiner* — Woo K Lee
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, first and second fin structures formed over the substrate, and an isolation structure between the first and second fin structures. The isolation structure can include a lower portion and an upper portion. The lower portion of the isolation structure can include a metal-free dielectric material. The upper portion of the isolation structure can include a metallic element and silicon.

20 Claims, 27 Drawing Sheets

ISOLATION STRUCTURES OF SEMICONDUCTOR DEVICES

BACKGROUND

Advances in semiconductor technology have increased the demand for semiconductor devices with higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and nano-sheet field effect transistors (NSFETs). Such scaling down has increased the complexity of semiconductor device manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
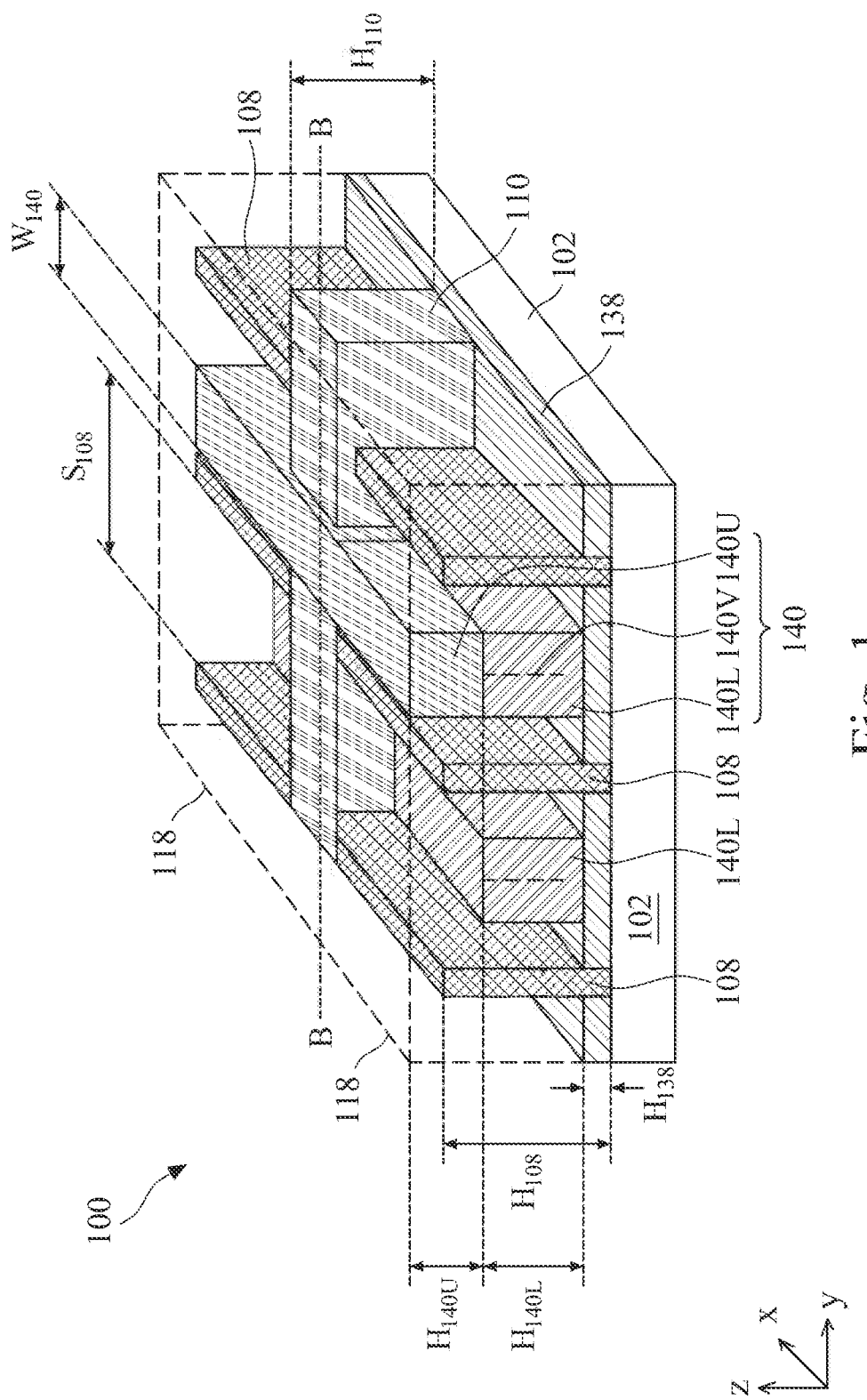
FIG. 1 illustrates an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., $\pm 1\%$, $\pm 2\%$, $\pm 3\%$, $\pm 4\%$, $\pm 5\%$ of the value). These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to the surface of a substrate.

Fins associated with fin field effect transistors (finFETs) or gate-all-around (GAA) FETs can be patterned by any suitable method. For example, the fins can be patterned using one or more photolithography processes, including a datable-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers can then be used to pattern the fins.

Technology advances in the semiconductor industry drive the pursuit of integrated circuits (IC)s having higher device density, higher performance, and lower cost. In the course of the IC evolution, fin structures have been adopted to implement various three dimensional (3D) field-effect transistors (FETs), such as fin-type field effect transistor (FinFET) and gate-all-around (GAA) FETs, to achieve ICs with higher device densities. Additionally, a vertical dielectric structure, which is also referred to herein as a "hybrid fin," can be placed between two laterally adjacent fin structures to separate metal gate lines between transistors within the IC. For example, the hybrid fin's upper portion can be formed through the metal gate lines of two laterally adjacent fin structures to form an electrical isolation between the adjacent fin structures. However, as transistor size shrinks, the separation between laterally adjacent fin structures is reduced. The reduced separation between two lateral adjacent fin structure can result in voids in the upper portion of the hybrid fins. The voids in the upper portion of the hybrid fins can degrade the isolation between two laterally adjacent fin structures, thus degrading the IC manufacturing's yield.

The present disclosure is directed to a fabrication method and an isolation structure (e.g., hybrid fin) formed between two laterally adjacent fin structures on a substrate. The lower portion of the isolation structure can be made of a first dielectric layer, and the upper portion of the isolation structure can be made of a second dielectric layer. The second dielectric layer can have a greater dielectric constant than the first dielectric layer. For example, both first and second dielectric layers can include silicon, where the second dielectric layer can further include a metal element, such as hafnium, and oxygen. The second dielectric layer can be selectively removed, via an etching process, over the first dielectric layer to connect the gate metal lines formed over the two laterally adjacent fin structures. Further, the second dielectric layer can be a seamless layer (e.g., the second dielectric layer does not have voids). Hence, the isolation structure with both the upper and lower portions can sufficiently isolate the two laterally adjacent fin structures. A benefit of the present disclosure, among others, is to reduce or eliminate the voids in the isolation structure to separate the gate metal line connection between fin structures, thus avoiding transistor failures within the IC.

A semiconductor device 100 having an isolation structure 140 formed over a substrate 102 is described with reference to FIG. 1, according to some embodiments, FIG. 1 illustrates an isometric view of semiconductor device 100, according to some embodiments. Semiconductor device 100 can be included in a microprocessor, memory cell, or other integrated circuit (IC).

Referring to FIG. 1, substrate 102 can be a semiconductor material, such as silicon. In some embodiments, substrate 102 can include a crystalline silicon substrate (e.g., wafer). In some embodiments, substrate 102 can include (i) an elementary semiconductor, such as silicon (Si) or germanium (Ge); (ii) a compound semiconductor including silicon carbide (SiC), gallium arsenide (GaAs), gallium phosphide (GaP), indium phosphide (InP), indium arsenide (inAs), and/or indium antimonide (InSb); (iii) an alloy semiconductor including silicon germanium carbide (SiGeC), silicon germanium (Site), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 102 can be doped depending on design requirements (e.g., p-type substrate or n-type substrate). In some embodiments, substrate 102 can be doped with p-type dopants (e.g., boron (B), indium (In), aluminum (Al), or gallium (Ga)) or n-type dopants (e.g., phosphorus (P) or arsenic (As)).

Semiconductor device 100 can include multiple fin structures 108 formed over substrate 102. Each fin structure 108 can extend along an x-axis and traverse along a y-axis. Further, each of fin structures 108 can have a height $H_{108}$ formed over substrate 102 and be laterally in the y-direction) separated from one another by a separation $S_{108}$. In some embodiments, height $H_{108}$ can be from about 120 nm to about 170 nm. If height $H_{108}$ is less than the above-noted lower limits, semiconductor device 100 may not provide sufficient driving current for the IC. If height $H_{108}$ is greater than the above-noted upper limits, fin structure 108's mechanical strength ma not support fin structure 108's structural integrity (e.g., fin structure 108 may collapse.) In some embodiments, separation $S_{108}$ can be from about 20 nm to about 50 nm. If separation $S_{108}$ is less than the above-noted lower limits, the parasitic capacitance between two laterally (e.g., in the y-direction) adjacent fin structures 108 may be increased to degrade semiconductor device 100's speed. If separation $S_{108}$ is greater than the above-noted upper limits, semiconductor device 100 may not meet the fin pitch requirement determined by the respective technology node (e.g., fin pitch may be required to be less than about 60 nm for a 22 nm technology node). In some embodiments, a ratio of height $H_{108}$ to separation $S_{108}$ can be from about 2 to about 9. If the ratio of height $H_{108}$ to separation $S_{108}$ is less than the above-noted lower limits, semiconductor device 100 may not meet the fin pitch requirement determined by the respective technology node (e.g., fin pitch may be required to be less than about 60 nm for a 22 nm technology node). If the ratio of height $H_{108}$ to separation $S_{108}$ is greater than the above-noted upper limits, fin structure 108's mechanical strength may not support fin structure 108's structural integrity (e.g., fin structure 108 may collapse.)

Fin structure 108 can include a first portion traversed by gate structure 110 (discussed below) and a second portion laterally (e.g., in the y-direction) adjacent to the first portion. In some embodiments, fin structure 108's first and second portions can be a channel region and a source/drain (S/D) region of a transistor of semiconductor device 100. Each of fin structure 108's first and second portions can be made of a material similar to substrate 102, such as a material having a lattice constant substantially close to (e.g., lattice mismatch within 5%) that of substrate 102. In some embodiments, fin structure 108's first and/or second portions can be made of a material identical to substrate 102. Each of fin structure 108's first and second portions can be un-doped, doped with p-type dopants, doped with n-type dopants, or doped with intrinsic dopants. In some embodiments, fin structure 108's first and second portions can be doped with dopants with different doping type (e.g., n-type or p-type) from one another.

Semiconductor device 100 can further include a gate structure 110 that wraps around one or more fin structures 108. Gate structure 110 can have a height $H_{110}$, such as from about 80 nm to about 110 nm. Gate structure 110 can include a gate dielectric layer (not shown in FIG. 1) and a gate electrode (not shown in FIG. 1) disposed on the gate dielectric layer. The gate dielectric layer can include any suitable dielectric material, such as a low-k dielectric material and a high-k dielectric material, with any suitable thickness, such as from about 1 nm to about 5 nm, that can provide channel modulation for fin structure 108. In some embodiments, the term "low-k dielectric material" can refer to a dielectric material with a dielectric constant less than about 3.9. In some embodiments, the low-k dielectric material for the gate dielectric can include silicon oxide or silicon nitride. In some embodiments, the term "high-k dielectric material" can refer to a dielectric material with a dielectric constant greater than about the dielectric constant of the low-k dielectric material. For example, the dielectric constant of the high-k dielectric material can be greater than about 3.9. In some embodiments, the high-k dielectric material for the gate dielectric can include hafnium oxide, aluminum oxide, or the combination thereof. Based on the disclosure herein, other materials and thicknesses for the gate dielectric layer are within the spirit and scope of this disclosure.

The gate electrode of gate structure 110 can include any suitable conductive material that provides a suitable work function to modulate fin structure 108. In some embodiments, the gate electrode can include titanium nitride, tantalum nitride, tungsten nitride, titanium, aluminum, copper, tungsten, tantalum, copper, or nickel. Based on the disclosure herein, other materials for the gate electrode are within the spirit and scope of this disclosure.

Gate structure 110 can further include a gate spacer (not shown in FIG. 1) formed over the gate electrode and/or the gate dielectric layer. In some embodiments, the gate spacer can be further formed over fin structure 108's side surface (not shown in FIG. 1). The gate spacer can be made of any suitable dielectric material, such as the low-k dielectric material and the high-k dielectric material. Based on the disclosure herein, other materials for the gate spacer are within the spirit and scope of this disclosure.

Semiconductor device 100 can further include shallow trench isolation (STI) regions 138 to provide electrical isolation between fin structures 108. Also, STI regions 138 can provide electrical isolation between fin structures 108 and neighboring active and passive elements (not shown in FIG. 1) integrated with or deposited on substrate 102. STI regions 138 can include insulating layers with a suitable height $H_{138}$, such as from about 40 nm to about 60 nm, disposed on substrate 102 and between fin structures 108. In some embodiments, the term "insulating layer" can refer to a layer that functions as an electrical insulator (e.g., a dielectric layer). In some embodiments, the insulating layer for STI region 138 can include silicon oxide, silicon nitride, silicon oxynitride, fluorine-doped silicate glass (FSG), a low-k dielectric material, or a high-k dielectric material. Based on the disclosure herein, other materials and thicknesses for STI region 138 are within the spirit and scope of this disclosure.

Semiconductor device 100 can further include an isolation structure 140 disposed between two laterally (e.g., in the y-direction) adjacent fin structures 108. Accordingly, isolation structure 140's width $W_{140}$ can be less than separation $S_{108}$ between the two laterally (e.g., in the y-direction) adjacent fin structures 108. In some embodiments, isolation structure 140's width $W_{140}$ can be from about 10 nm to about 40 nm. Isolation structure 140 can further horizontally (e.g., in the x-direction) extend through gate structure 110 that travers isolation structure 140's two laterally (e.g., in the y-direction) adjacent fin structures 108. In some embodiments, isolation structure 140 can electrically isolate gate structure 110 that is traversed by isolation structure 140. Accordingly, a segment of gate structure 110 on one fin structure 108 can be electrically insulated from another segment of gate structure 110 on the laterally (e.g., in the y-direction) fin structure 108 by isolation structure 140.

Isolation structure 140 can include a first dielectric layer 140L disposed over STI region 138. First dielectric layer 140L can be made of a tow-k dielectric material to electrically, isolate the two laterally adjacent fin structures 108 placed at opposite sides of isolation structure 140. In some embodiments, the tow-k dielectric material for first dielectric layer 140L can be a metal-free dielectric material, such as silicon oxide and silicon nitride. In some embodiments, first dielectric layer 140L can embed void structure 140V. In some embodiments, the lateral (e.g., in the y-direction) a separation between void structure 140V and one of the isolation structure 140's two laterally (e.g., in the y-direction) adjacent fin structures 108 can be substantially equal to another separation between void structure 140V and another of the isolation structure 140's two laterally (e.g., in the y-direction) adjacent fin structures 108.

First dielectric layer 140L can horizontally (e.g., in the x-direction) extend through a bottom portion of the gate structure 110 that traverses the isolation structure 140's two laterally adjacent fin structures 108, where an upper portion of the gate structure 140 can be formed over first dielectric layer 140L. For example, the gate structure 110 that is extended through by first dielectric layer 140L can have a height $H_{110}$, where gate structure 110's height $H_{110}$ can be greater than first dielectric layer 140L's height $H_{140L}$. In some embodiments, first dielectric layer 140L's height $H_{140L}$ can be from about 50 nm to about 80 nm. In some embodiments, first dielectric layer 140L's width can be substantially equal to width $W_{140}$, where a ratio of first dielectric layer 140L's height $H_{140L}$ to width $W_{140}$ can be from about 1.2 to about 8 or from about 2 to about 5. If the ratio of the height $H_{140L}$ to width $W_{140}$ is less than the above-noted lower limits, the fin pitch of semiconductor device 100 may not be sufficient to accommodate first dielectric layer 140L (e.g., fin pitch may be required to be less than about 60 nm for a 22 nm technology node). If the ratio of the height $H_{140L}$ to width $W_{140}$ is greater than the above-noted upper limits, first dielectric layer 140L may collapse due to first dielectric layer 140L's limited mechanical strength.

In some embodiments, isolation structure 140 can further include a second dielectric layer 140U disposed over first dielectric layer 140L. Second dielectric layer 140U can be made of a high-k dielectric material, such as a metal oxide, to electrically isolate the two laterally adjacent fin structures 108 placed at opposite sides of isolation structure 140. Accordingly, first dielectric layer 140L and second dielectric layer 140U can have different etching selectivity from each other. In some embodiments, the term "etching selectivity" can refer to the ratio of the etch rates of two materials under a same etching condition. In some embodiments, second dielectric layer 140U can be made of an oxide material that includes a metallic element, silicon, and oxygen. In some embodiments, second dielectric layer 140U can be made of a cross-linked mixture (e.g., polymer 2108 shown in FIG. 21) of a metal oxide and a silicon oxide. In some embodiments, second dielectric layer 140U can be made of a metal oxide doped with a dopant. The dopant doped in the metal oxide of second dielectric layer 140U can be silicon, germanium, aluminum, a transition metal, or a rare-earth metal. The dopant (e.g., silicon and/or germanium) doped in the metal oxide of second dielectric layer 140U can have the atomic concentration of the silicon doped in the metal oxide can be from about 4% to about 20%. If the atomic concentration of the dopant is less than the above-noted lower limits, second dielectric layer 140U's dielectric constant may be too high to cause an increased parasitic capacitance in semiconductor device 100. If the atomic concentration of the dopant is greater than the above-noted lower limits, there may not have sufficient etching selectivity between first dielectric layer 140L and second dielectric layer 140U to connect gate structure 110 between two laterally (e.g., in the y-direction) fin structures 108 (discussed in method 200). In some embodiments, second dielectric layer 140U can be a seamless dielectric layer (e.g., second dielectric layer 140U does not embed void structures) to ensure an sufficient electrical isolation between the isolation structure 140's two laterally adjacent fin structures 108.

Second dielectric layer 140U can horizontally (e.g., in the x-direction) extend through the gate structure 110 that traverses the isolation structure 140's two laterally adjacent fin structures 108. Further, second dielectric layer 140U can have a height $H_{140U}$ formed over first dielectric layer 140L that allows second dielectric layer 140U being formed over the gate structure 110 that traverses the isolation structure 140's two laterally adjacent fin structures 108. Accordingly, isolation structure 140's height (e.g., equal to the sum of first dielectric layer 140L's height $H_{140L}$ and second dielectric layer 140U's height $H_{140U}$) can be greater than gate structure 110's height $H_{110}$. In some embodiments, second dielectric layer 140U's height $H_{140U}$ can be from about 15 nm to about 40 nm. In some embodiments, a ratio of isolation structure 140's height (e.g., the sum of heights $H_{140L}$ and $H_{140U}$) to gate structure 110's height $H_{110}$ can be from about 1.1 to about 2.0. If the ratio of isolation structure 140's height (e.g., the sum of heights $H_{140L}$ and $H_{140U}$) to gate structure 110's height $H_{110}$ is less than the above-noted lower limits, second dielectric layer 140U may not provide an sufficient isolation between isolation structure 140's two laterally (e.g., in the y-direction) adjacent fin structures 108. If the ratio of isolation structure 140's height (e.g., the sum of heights $H_{140L}$ and $H_{140U}$) to gate structure 110's height $H_{110}$ is greater than the above-noted upper limits, isolation structure 140 may collapse due to isolation structure 140's limited mechanical strength. In some embodiments, second dielectric layer 140U's width can be substantially equal to width $W_{140}$.

In some embodiments, a ratio of isolation structure 140's height (e.g., the sum of heights $H_{140L}$ and $H_{140U}$) to isolation structure 140's width $W_{140}$ can be from about 2 to about 11. If the ratio of isolation structure 140's height (e.g., the sum of heights $H_{140L}$ and $H_{140U}$) to isolation structure 140's width $W_{140}$ is less than the above-noted lower limits, semiconductor device 100 may not meet the fin pitch requirement determined by the respective technology node (e.g., fin pitch may be required to be less than about 60 nm for a 22 nm technology node). If the ratio of isolation structure 140's height (e.g., the sum of heights $H_{140L}$ and $H_{140U}$) to isolation structure 140's width $W_{140}$ is greater than the above-noted upper limits, isolation structure 140 may collapse due to isolation structure 140's limited mechanical strength.

In some embodiments, a ratio of second dielectric layer 140U's height $H_{140U}$ to first dielectric layer 140L's height $H_{140L}$ can be from about 0.15 to about 0.8. If the ratio of height $H_{140U}$ to height $H_{140L}$ is less than the above-noted lower limits, first dielectric layer 140L may be damaged during the process of forming gate structure 110 (discussed below at operation 220), thus causing the failure the electrical short in semiconductor device 100. If the ratio of height $H_{140U}$ to height $H_{140L}$ is greater than the above-noted upper limits, the parasitic capacitance between isolation structure 140's two laterally (e.g., in the y-direction) fin structures 108 can be too high to degrade semiconductor device 100's speed.

Semiconductor device 100 can further include an interlayer dielectric (ILD) layer 118 to provide electrical isolation to structural elements it surrounds or covers, such as fin structure 108 and gate structure 110. ILD layer 118 can include any suitable dielectric material to provide electrical insulation, such as silicon oxide, silicon dioxide, silicon oxycarbide, silicic n oxynitride, silicon oxy-carbon nitride, and silicon carbonitride. ILD layer 118 can have any suitable thickness, such as from about 50 nm to about 200 nm, to provide electrical insulation. Based on the disclosure herein, other insulating materials and thicknesses for ILD layer 118 are within the scope and spirit of this disclosure.

Figure 2:
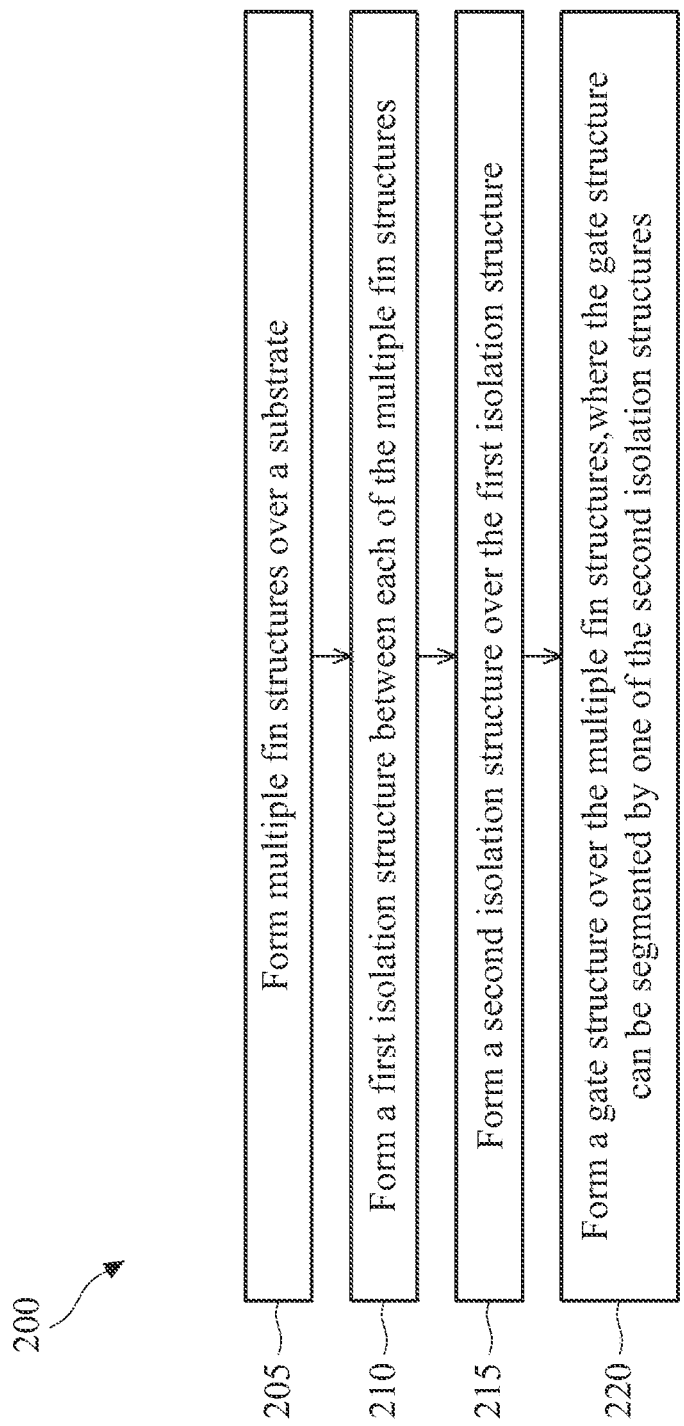
FIG. 2 is a flow diagram of a method for fabricating a semiconductor device, according to some embodiments.

FIG. 2 is a flow diagram of an example method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3-27. FIGS. 3-18, 20, and 22-27 are cross-sectional views along line B-B of FIG. 1 at various stages of its fabrication, according to some embodiments. FIGS. 19 and 21 illustrate chemical formula of isolation structure 140's material at various stages of its fabrication, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Further, the discussion of elements in FIGS. 1-27 with the same annotations applies to each other, unless mentioned otherwise.

Figure 3:
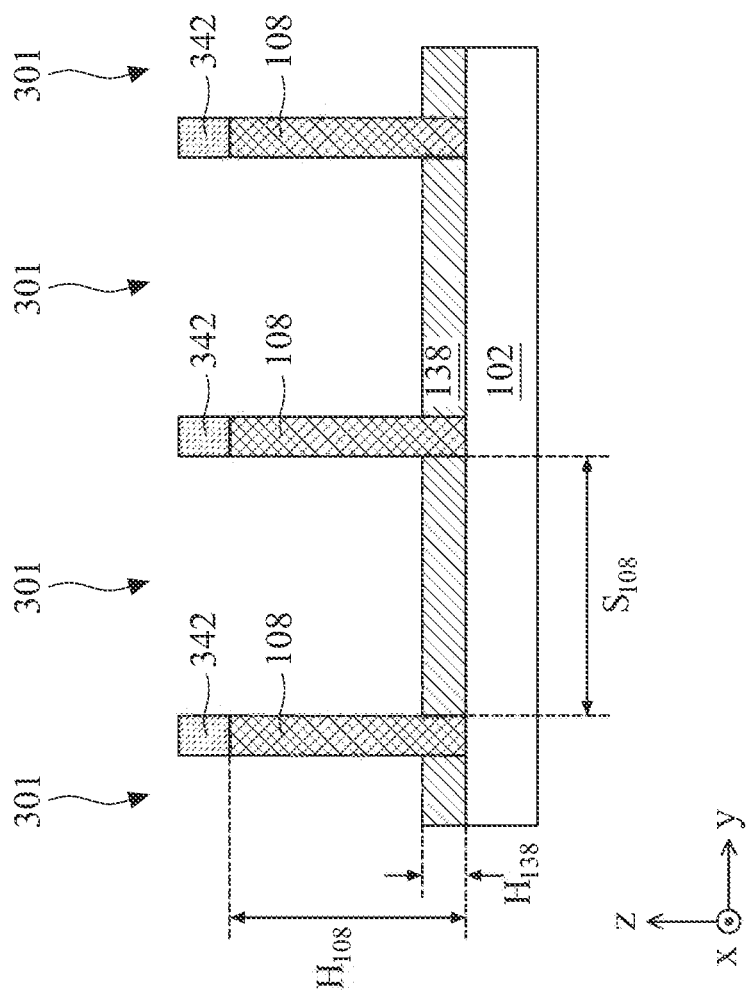
FIGS. 3-18, 20, and 22-27 illustrate cross-sectional views of a semiconductor device at various stages of its fabrication process, according to some embodiments.

Referring to FIG. 2, in operation 205, multiple fin structures are formed on a substrate. For example, as shown in FIG. 3, fin structures 108 with separation $S_{108}$ can be formed on substrate 102. The process of forming fin structures 108 can include (i) forming, using a lithography process, multiple patterned hard mask layers 342 with separation $S_{108}$ and over substrate 102, (ii) etching portions of substrate 102 through patterned hard mask layers 342 to form recess structures 301 with height $H_{108}$ over substrate 102, and (iii) forming STI region 138 with height $H_{138}$ in recess structures 301 and over the etched substrate 102 using a deposition process and an etch back process. In some embodiments, hard mask layer 342 can be made of a low-k dielectric material, such as silicon oxide and silicon nitride. The etching of the portions of substrate 102 can include a dry etch, a wet etch process, or a combination thereof. The dry etch process for etching substrate 102 can include using etchants with an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), or an iodine-containing gas. The wet etch process for etching substrate 102 can include etching in diluted hydrofluoric acid (DHF), potassium hydroxide (KOH) solution, ammonia, a solution containing hydrofluoric acid (HF), nitric acid ($HNO_3$), or acetic acid ($CH_3COOH$).

Referring to FIG. 2, in operation 210, a first isolation structure is formed between each of the multiple fin structures. For example, as shown in FIG. 6, first dielectric layer 140L can be formed between two laterally (e.g., in the y-direction) adjacent fin structures 108 with reference to FIGS. 4-6. The process of forming first dielectric layer 140L can include depositing a seed layer, such as seed layer 402 (shown in FIG. 4), over side surfaces of fin structures 108 of the structure of FIG. 3. Seed layer 402 can be made of any suitable semiconductor material, such as silicon germanium, that can be selectively deposited on a semiconductor surface (e.g., over fin structure 108's side surfaces) over a dielectric surface (e.g., STI region 138's top surface), using any suitable deposition process, such as a chemical vapor deposition (CVD) process and an atomic layer deposition (ALD) process. In some embodiments, seed layer 402 formed over two opposite sides of fin structures 108 can be merged with each other, and therefore seed layer 402 can be in contact with a top surface and side surfaces of patterned hard mask layers 342.

In some embodiments, the process of depositing the seed layer can further include forming a capping layer 404 (shown in FIG. 4) over seed layer 402 using a selective deposition process. In some embodiments, capping layer 404 can be a semiconductor material that is different from seed layer 402, where the respective selective deposition process can be a CVD process or an ALD process. In some embodiments, capping layer 404 can be a dielectric material, such as silicon oxide and silicon nitride, where the respective selective deposition process can include a silylation process and a deposition process. The silylation process can form a layer of inhibitor material (not shown in FIG. 4) over the exposed dielectric surfaces (e.g., STI regions 138's top surface) in recess structures 301. Because the layer of inhibiting material can inhibit the nucleation of depositing the dielectric materials for capping layer 404, the deposition of the dielectric materials for capping layer 404 can be delayed or inhibited over STI regions 138. Therefore, the above-noted selective deposition process can selectively form capping layer 404 over seed layer 402. In some embodiments, the chemical agent applied by the silylation process can include dimethylsilane (DMS), trimethylsilane (TMS), dimethytaminotrimethylsilane (DMA-TMS), octadecyltrichlorosilane (OTS), florooctyltriclorosilane (FOTS), dichlorodimethylsilane (DMDCS), trimethylsilydiethylamine (TMSDEA), trimethylsilylacetylene (TMSA), (chloromethyl)dimethylchlorosilane (CMDMCS), (chloromethyl)dimethylsilane (CMDMS), hexamethyldisilazane MUDS), tert-Butyldimethylsilane (TBDMS), octamethylcyclotetrasilaxane (OMCTS), bis(dimethylamino)dimethylsilane (DMADMS), or trimethylchlorosilane (TMCS). In some embodiments, the process of forming seed layer 402 and/or forming capping layer 404 can define recess structure 301's width WHO (later becoming isolation structure 140's width $W_{140}$ after method 200).

Figure 4:
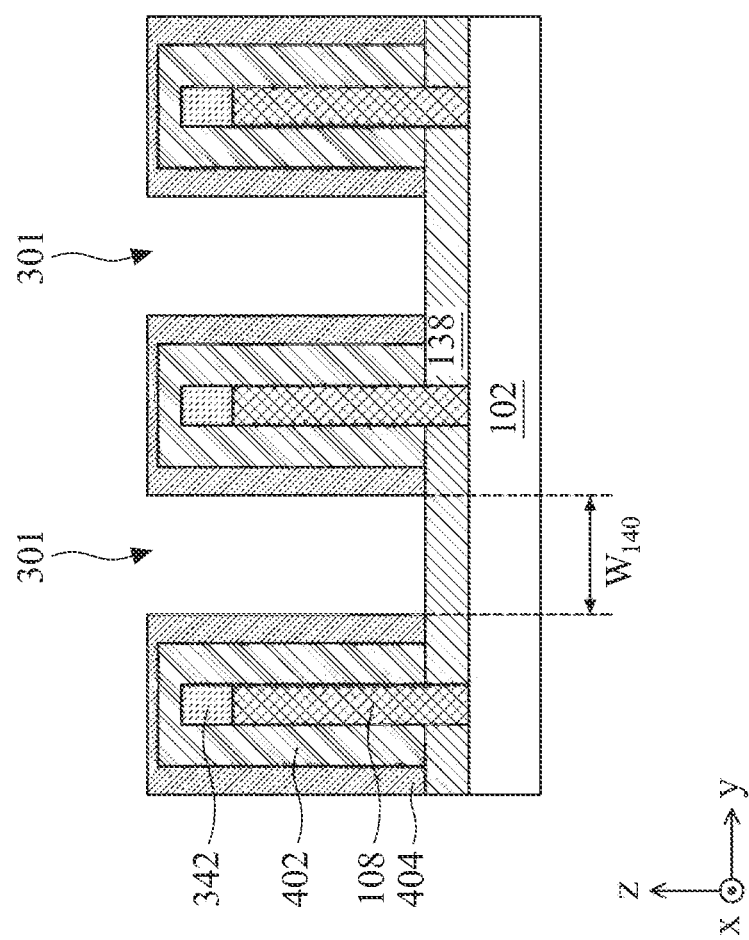
Figure 5:
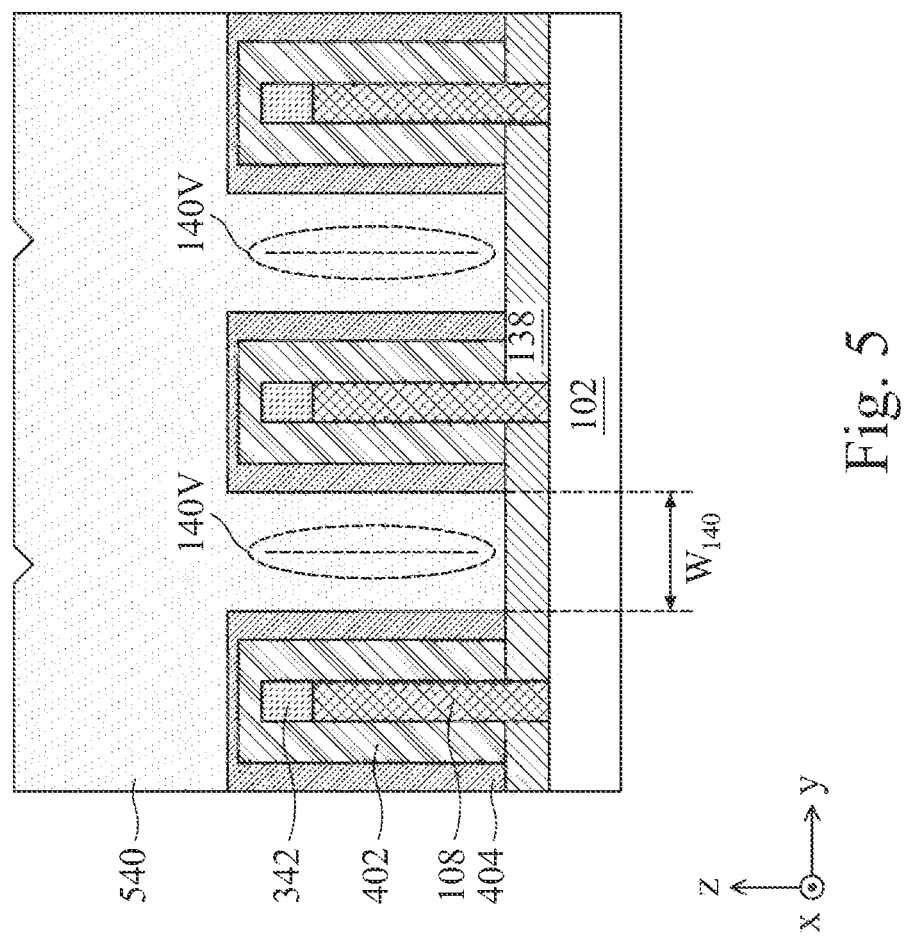
Figure 6:
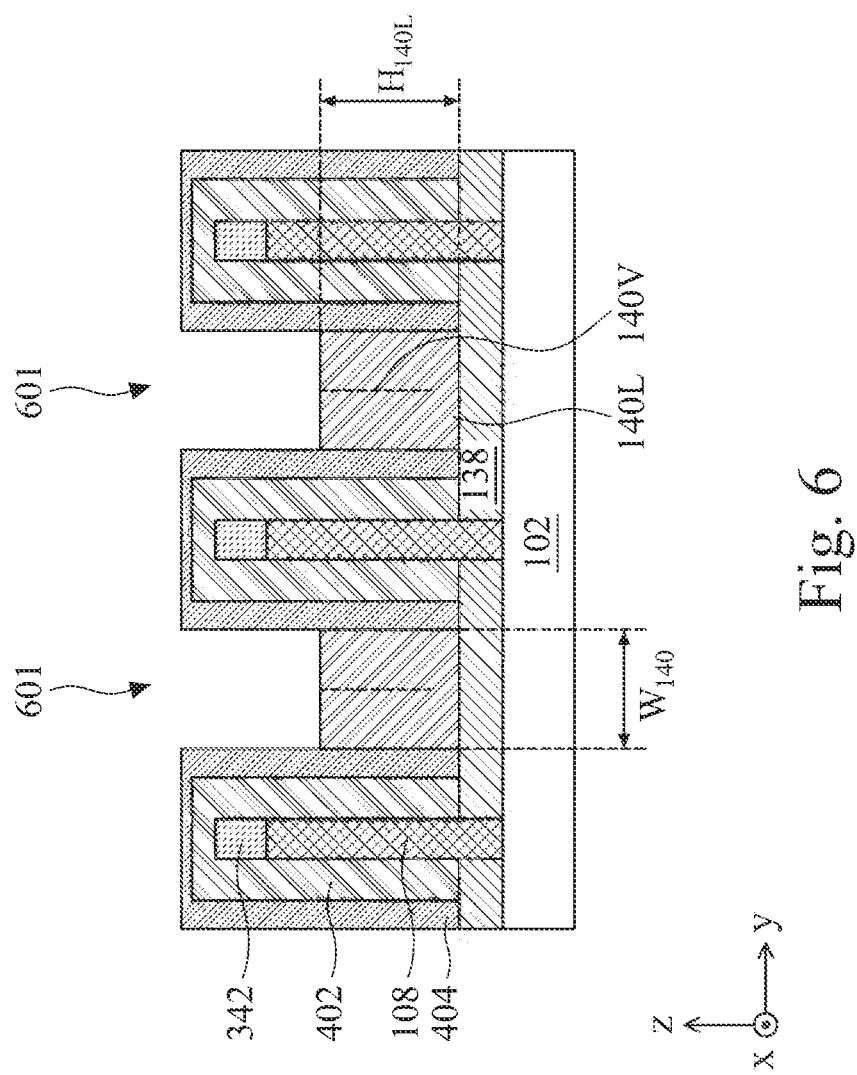

Referring to FIG. 5, the process of forming first dielectric layer 140L can include forming a dielectric material 540 in recess structures 301 and over seed layer 402 (or over capping layer 404) of the structure of FIG. 4 using a deposition process, such as a CVD process, an ALD process, a high-density-plasma (HDP) CVD process, a high aspect-ratio process (HARP), and a spin-on process. Dielectric material 540 can be made of identical material of first dielectric layer 140L discussed in FIG. 1. In some embodiments, the process for forming dielectric material 540 can have a substantially equal deposition rates at the proximities of recess structure 301's top and bottom (e.g., a conformal deposition process) to form void structures 140V (shown in FIG. 5) in portions of dielectric material 540 in recess structures 301. In some embodiments, the process for forming dielectric material 540 can have higher deposition rates proximate to recess structure 301's top than proximate to recess structure 301's bottom to form void structures 140V (shown in FIG. 5) in portions of dielectric material 540 in recess structures 301. In some embodiment, the process for forming dielectric material 540 can have a greater deposition rates proximate to recess structure 301's bottom than proximate to recess structure 301's top to eliminate void structures 140V.

Referring to FIG. 6, the process of forming first dielectric layer 140L can further include etching back dielectric material 540 to define first dielectric layer 140L. The process of etching back dielectric material 540 can include performing a polishing process, such as a chemical mechanical polishing (CMP) process, to planarize top surfaces of dielectric material 540 with hard mask layers 342, with seed layer 402, and/or with capping layer 404. The process of etching back dielectric material 540 can further include performing an etching process to remove portions of the planarized dielectric material 540 to form recess structures 601 between two laterally adjacent fin structures. After the etch back process, the resulting first dielectric layer 140L can have height $H_{140L}$ between first dielectric layer 140L's and STI regions 138.

Referring to FIG. 2, in operation 215, a second isolation structure is formed over the first isolation structure. For example, as shown in FIG. 13, second dielectric layer 140U can be formed over first dielectric layer 140L. In some embodiments, operation 215 can include performing a doping process to dope a spin-coated metal oxide to form second dielectric layer 140U with reference to FIGS. 7-13 (a doping mode). In some embodiments, operation 215 can include performing a laminate coating process to form second dielectric layer 140U with reference to FIGS. 13 and 14-17 (a laminate mode). In some embodiments, operation 215 can include performing a spin-coating process to coat a metal silicate material to form second dielectric layer 140U with reference to FIGS. 13 and 18-21 (a hybrid mode).

Figure 7:
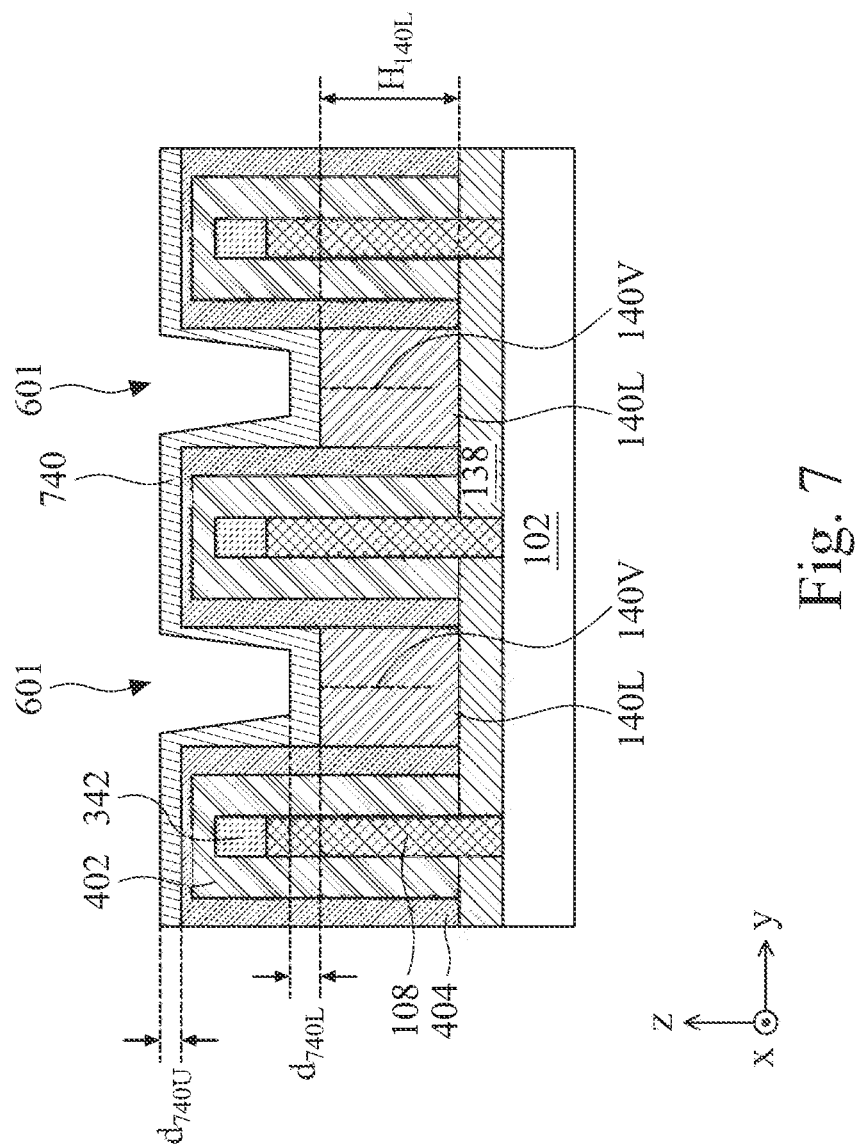
Figure 8:
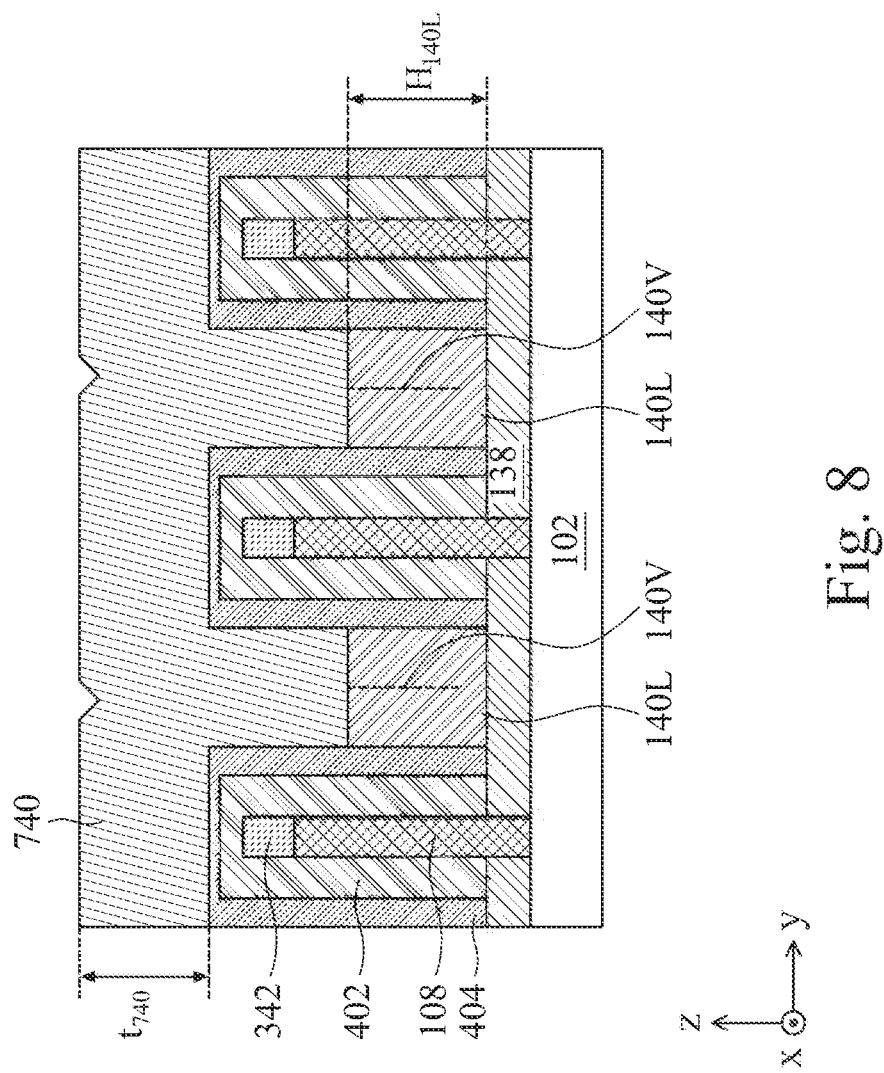

Referring to FIGS. 7 and 8, in the doping mode and with reference to FIGS. 7-13, operation 215 can include performing a sol-gel or a metalorganic frame process to spin-coat or dip-coat a flowable dielectric material to fill recess structures 601 of FIG. 6. The flowable dielectric material can include a metal oxide colloid. In some embodiments, the metal oxide colloid can include zirconium oxide ($ZrO_x$), hafnium oxide ($HfO_x$), aluminum oxide ($AlO_x$), or the combination thereof, where the metal oxide colloid's chemical formula can include the metallic elements of zirconium (Zr), hafnium (Hf), aluminum, a refractory metal, or a rare-earth metal.

The sol-gel or metalorganic frame process can further include performing an annealing process on substrate 102 to remove the solvent from the coated flowable dielectric material to form a metal oxide layer 740 (shown in FIG. 7 and/or FIG. 8) over first dielectric layer 140L and over fin structures 108. The annealing process can be performed at a temperature from about 50° C. to about 250° C. or from about 80° C. to about 200° C. with a suitable ambient gas environment, such as nitrogen and oxygen. If the temperature of the annealing process is less than the above-noted lower limits, the annealing process may not remove the solvent from the flowable dielectric material. If the temperature of the annealing process is greater than the above-noted upper limits, method 200 may not able to dope silicon element (discussed below) in metal oxide layer 740 to form second dielectric layer 140U to lower the dielectric constant of isolation structure 140, thus causing a high parasitic capacitance in semiconductor device 100. Further, the annealing process can be performed with a suitable time duration from about 30 seconds to about 180 seconds or from about 60 seconds to about 120 seconds. If the time duration of the annealing process is less than the above-noted lower limits, the annealing process may not remove the solvent from the flowable dielectric material. If the time duration of the annealing process is greater than the above-noted upper limits, method 200 may not meet the manufacturing throughput requirement to fabricate semiconductor device 100, thus increasing the production cost of semiconductor device 100.

In some embodiments, as shown in FIG. 7, metal oxide layer 740 formed by a cycle of the sol-gel process can have a bottom thickness $d_{740L}$ over first dielectric layer 140L and a top thickness $d_{740U}$ over fin structure 108 (e.g., a single cycle of the sol-gel process does not fill recess structure 601). Because the sol-gel process can direct the flowable dielectric material flowing towards recess structures 601, the resulting oxide layer 740's bottom thickness $d_{740L}$ (e.g., about 10 nm) can be greater than top thickness $d_{740U}$ (e.g., about 5 nm). In some embodiments, as shown in FIG. 8, one or more cycles of the sol-gel process can be performed to spin-coat or dip-coat the flowable dielectric material to fill recess structures 601 of FIG. 6 to form metal oxide layer 740 with a suitable thickness $t_{740}$, such as about 50 nm, over fin structures 108. Because each of the one or more cycles of the sol-gel process can direct the flowable dielectric material flowing towards recess structures 601, the resulting metal oxide layer 740 can be a seamless (e.g., without void structures) dielectric layer in recess structure 601.

Figure 9:
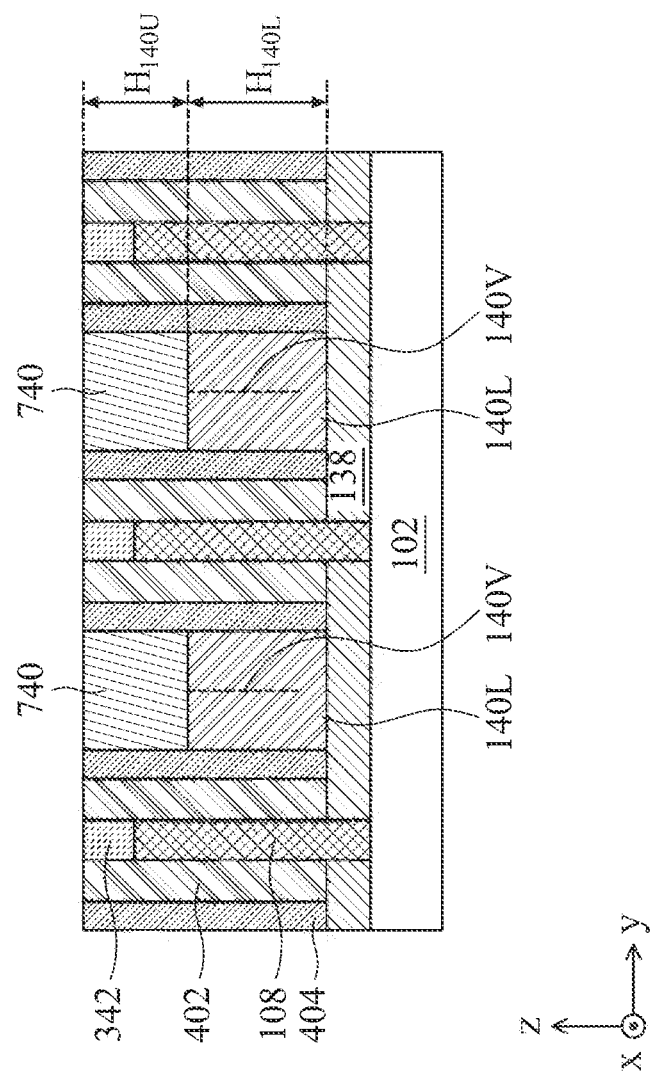
Figure 10:
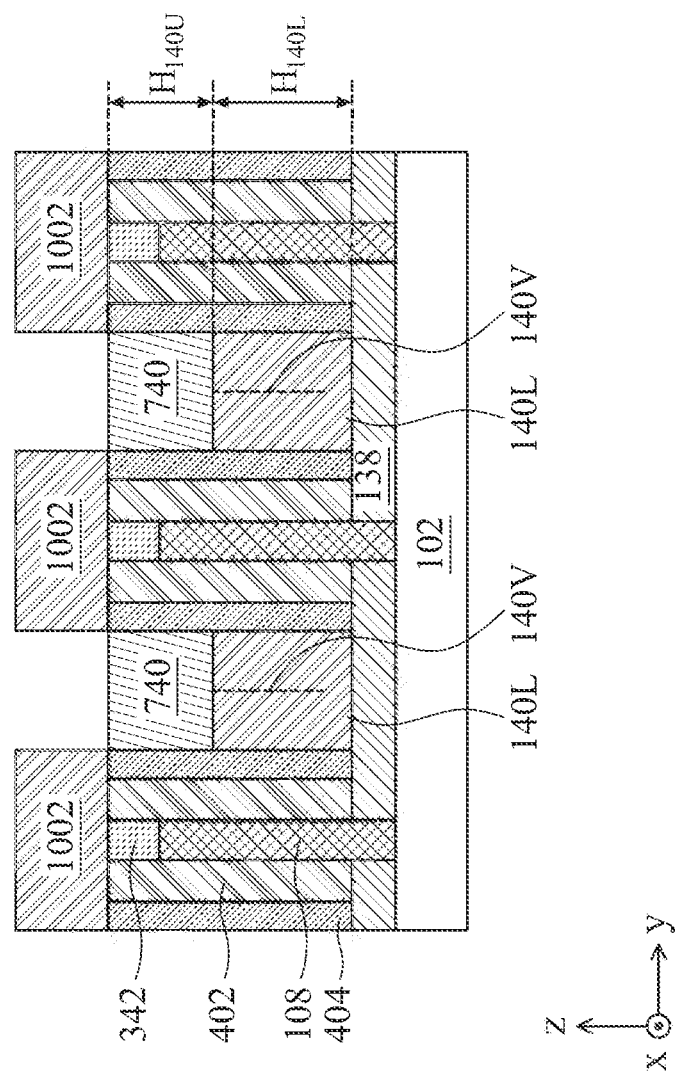
Figure 11:
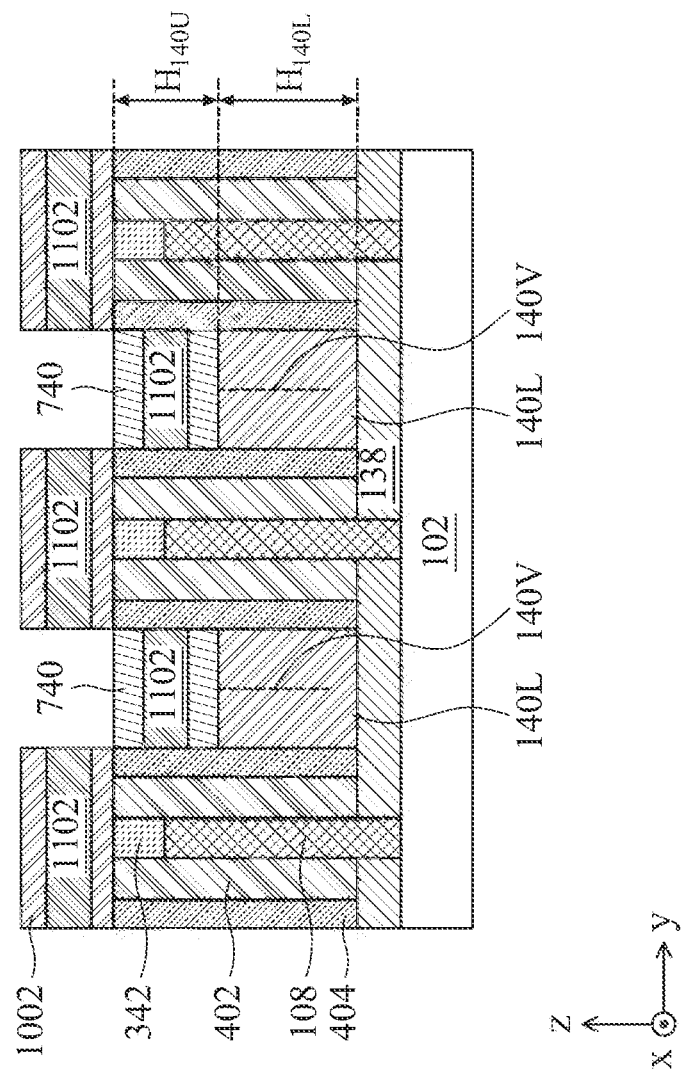

Referring to FIGS. 9-11, in the doping mode, operation 215 can further include (i) planarizing, via a CMP process, FIG. 8's metal oxide layer 740 to form FIG. 9's metal oxide layer 740 with height $H_{140U}$ and be coplanar with hard mask layers 342, (ii) forming, via a lithography process, hard mask layers 1002 (shown in FIG. 10) over fin structures 108, seed layers 402, and/or capping layers 404, and (iii) performing a doping process to provide dopants 1102 (shown in FIG. 11) in metal oxide layer 740. Dopant 1102 can include silicon, germanium, and/or aluminum that can reduce first dielectric layer 140L's dielectric constant after operation

215. The doping process can include a diffusion process or an implantation process to drive dopants 1102 into metal oxide layer 740 and hard mask layer 1002. In some embodiments, as shown in FIG. 11, dopant 1102 in metal oxide layer 740 and hard mask layer 1002 can include a peak doping concentration with a bandwidth defined by a full width of about 50%, about 70%, or about 90% of the peak doping concentration. In some embodiments, in the doping mode, operation 215 can further include forming a layer of dielectric material (e.g., an oxide layer; not shown in FIG. 9) over the structure of FIG. 9 before forming hard mask layers 1002.

Figure 12:
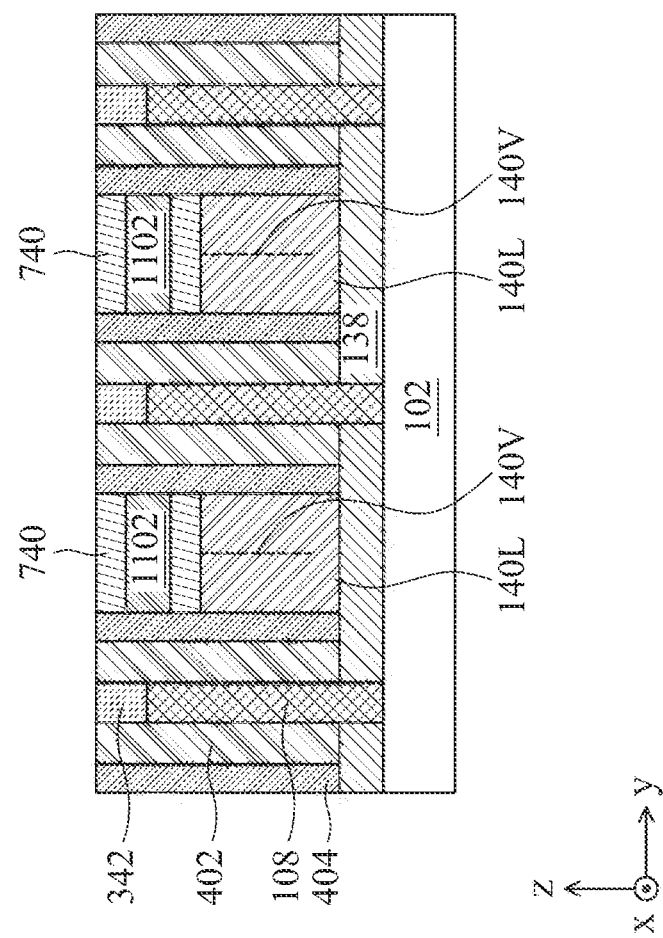
Figure 13:
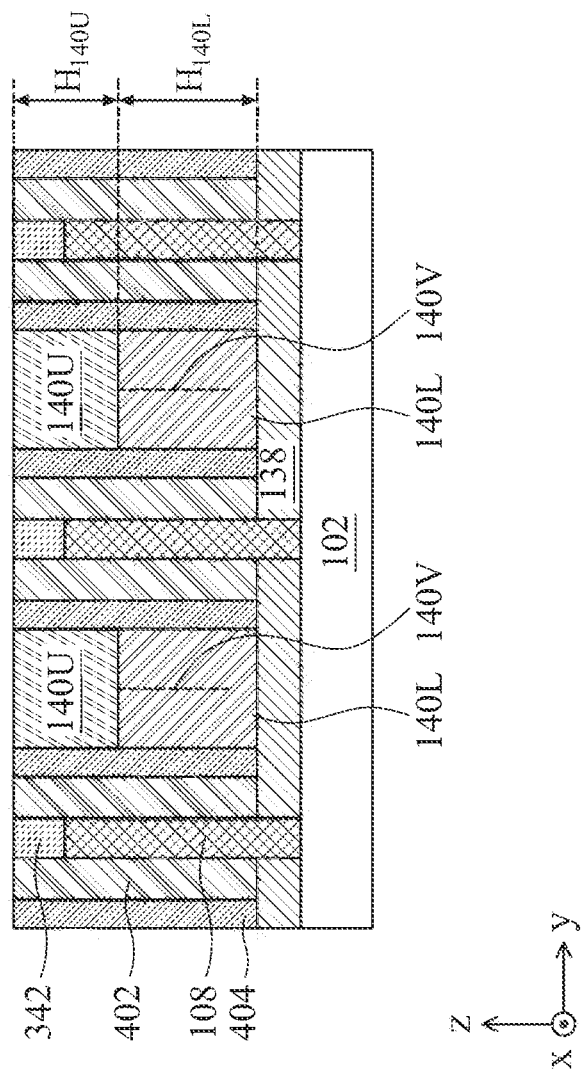

Referring to FIGS. 12 and 13, in the doping mode, operation 215 can further include (i) removing hard mask layers 1002 via an etching process (shown in FIG. 12), and (ii) performing an annealing process to activate dopants 1102 in metal oxide layer 740 and crystallize metal oxide layer 740 to form second dielectric layer 140U (shown in FIG. 13) over first dielectric layer 140L. The annealing process for activating dopants 1102 in metal oxide layer 740 and crystallizing metal oxide layer 740 can include a rapid thermal annealing process and/or a furnace annealing process with suitable time durations. In some embodiments, the time duration of the furnace annealing process can be at least about 5 times, at least about 10 times, at least about 20 times, at least about 50 times, or at least about 100 times greater than the time duration of the rapid thermal annealing process. In some embodiments, the annealing process for activating dopants 1102 in metal oxide layer 740 and crystallizing metal oxide layer 740 can be a rapid thermal annealing process with a suitable time duration from about 10 seconds to about 30 seconds. In some embodiments, to provide a sufficient thermal energy to activate dopants 1102 in metal oxide layer 740 and crystallize metal oxide layer 740, the annealing process for activating dopants 1102 in metal oxide layer 740 and crystallizing metal oxide layer 740 can be a furnace annealing process with a time duration greater than the time duration of the annealing process (e.g., for removing the solvent from the coated flowable dielectric material) performed with respect to FIG. 7 and/or FIG. 8. For example, the annealing process for activating dopants 1102 in metal oxide layer 740 and crystallizing metal oxide layer 740 can be a furnace annealing process with a time duration from 10 minutes to about 100 minutes or from 30 minutes to about 90 minutes. If the time duration of the furnace annealing process is less than the above-noted lower limits, the furnace annealing process may not crystallize metal oxide layer 740 and/or distribute dopants 1102 in metal oxide layer 740. If the time duration of the furnace annealing process is greater than the above-noted upper limits, isolation structure 140 formed by method 200 may become porous, thus causing a leakage current in semiconductor device 100.

Further, the annealing process can be performed at a temperature greater than the temperature of the annealing process performed with respect to FIG. 7 and/or FIG. 8 to provide a sufficient thermal energy to activate dopants 1102 in metal oxide layer 740 and crystallize metal oxide layer 740. For example, the annealing process can be performed at a temperature from about 550° C. to about 950° C., from about 600° C. to about 900° C., from about 700° C. to about 900° C., or from about 750° C. to about 900° C. with a suitable ambient gas environment, such as nitrogen and oxygen. If the temperature of the annealing process is less than the above-noted lower limits, the annealing process may not crystallize metal oxide layer 740 or distributing dopants 1102 in metal oxide layer 740. If the temperature of the annealing process is greater than the above-noted upper limits, isolation structure 140 formed by method 200 may become porous, thus causing a leakage current in semiconductor device 100.

Figure 14:
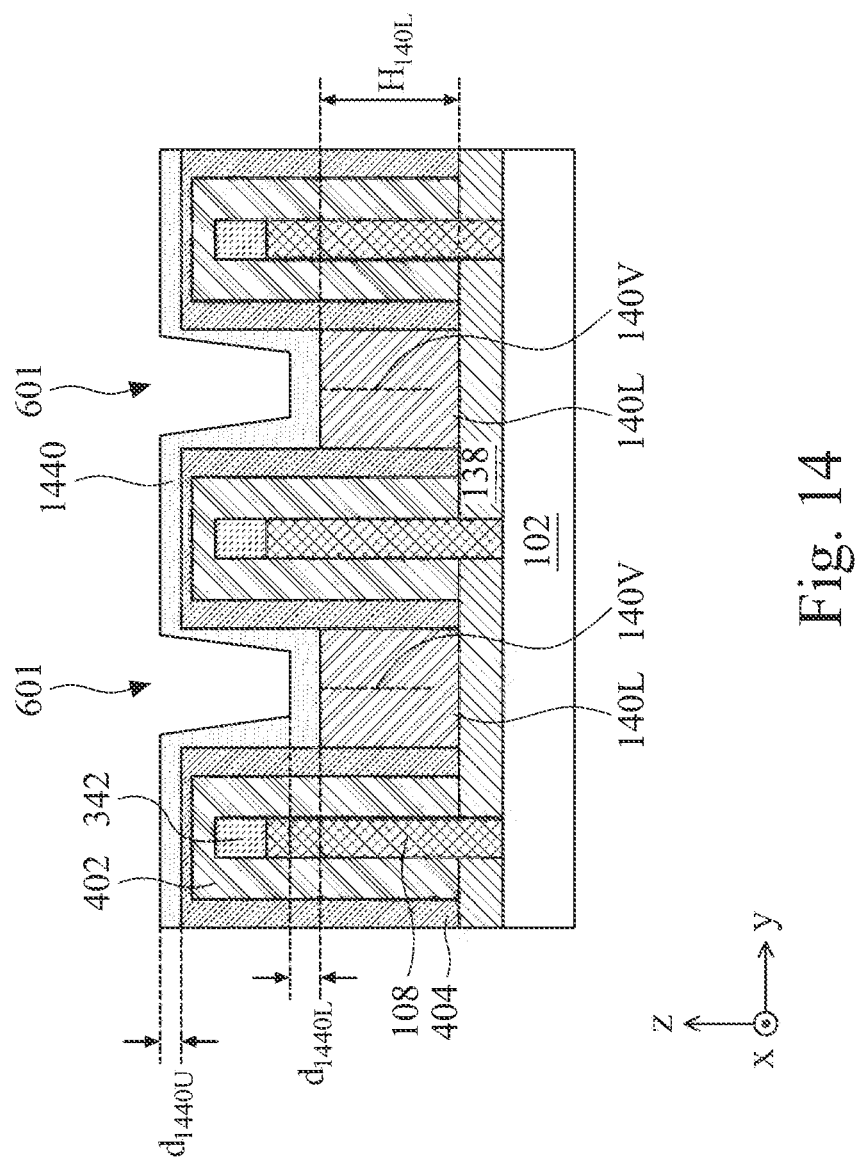
Figure 15:
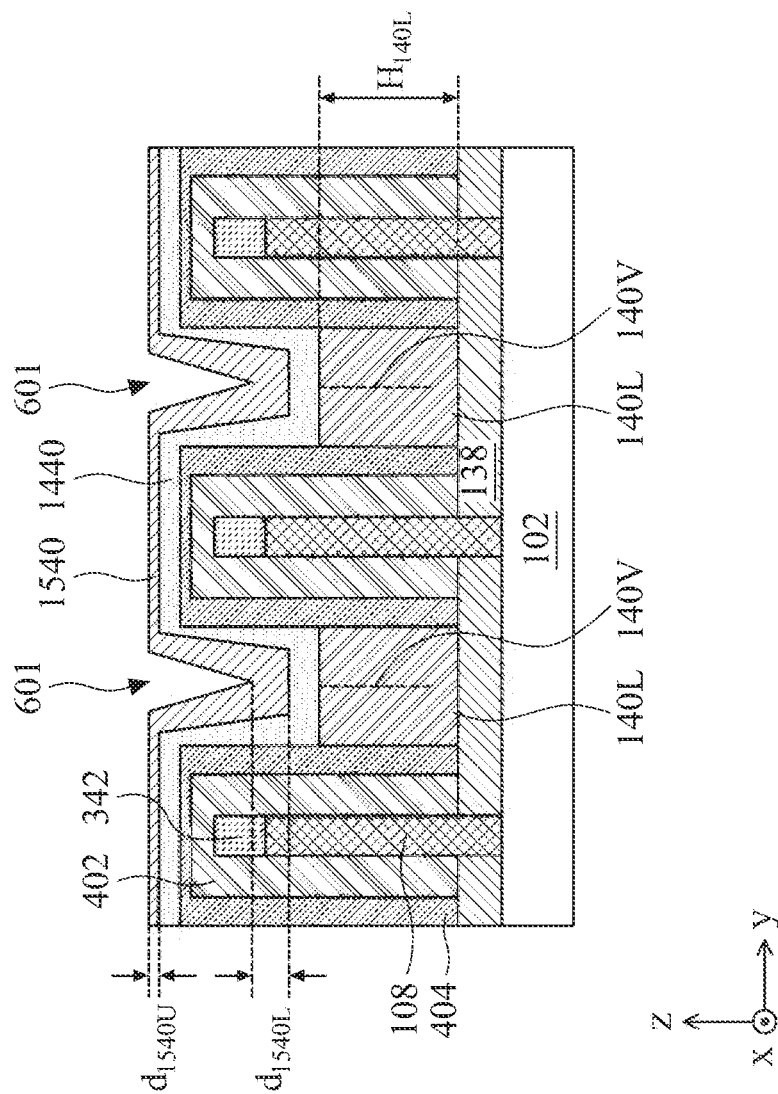
Figure 16:
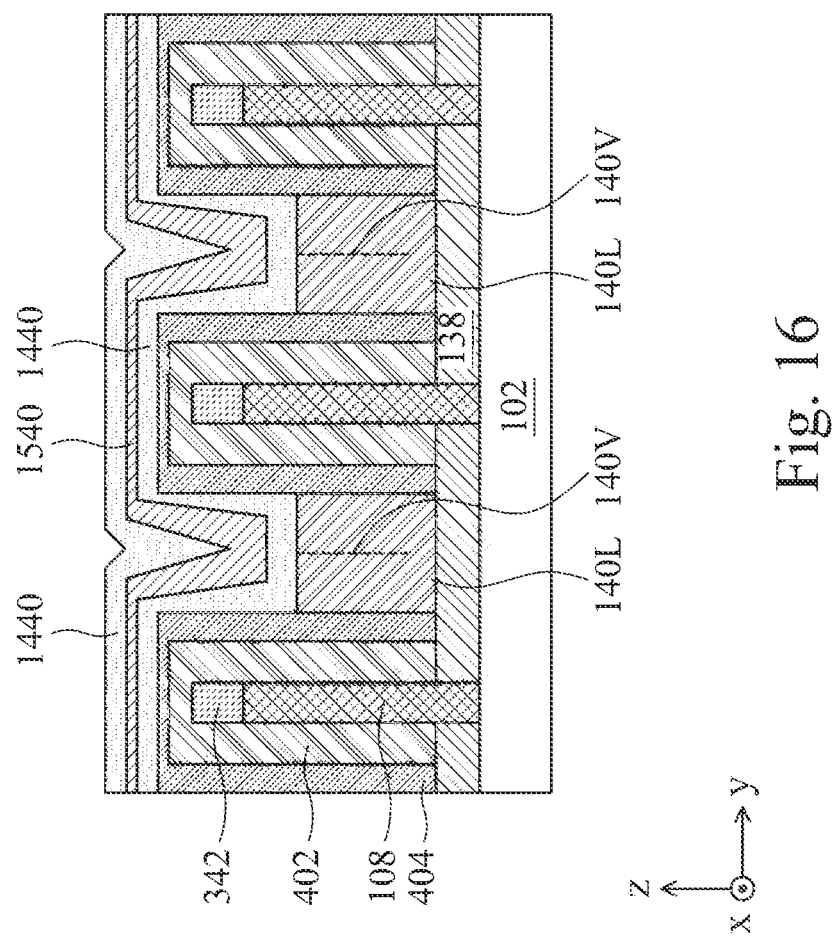

Referring to FIGS. 14-16, in the laminate mode and with reference to FIGS. 13 and 14-17, operation 215 can include performing a cyclic sol-gel process to spin-coat or dip-coat flowable dielectric material stack to fill recess structures 601 of FIG. 6. For example, the cyclic sol-gel process can include a first sol-gel process to coat a first flowable dielectric material to form a first oxide layer 1440 (shown in FIG. 14) over the structure of FIG. 6. The cyclic sol-gel process can further include a second sol-gel process to coat a second flowable dielectric material to form a second oxide layer 1540 (shown in FIG. 15) over first oxide layer 1440. The first flowable dielectric material can be different from the second flowable dielectric material. Accordingly, first oxide layer 1440 can be a different material from second oxide layer 1540. In some embodiments, the first flowable dielectric material can be a metal-contained colloid (e.g., identical to the metal oxide colloid discussed with respect to FIG. 7 and/or FIG. 8), and the second flowable dielectric material can be a metal-free colloid (e.g., PFOTES or FTES). Accordingly, first oxide layer 1440 can be a metal oxide layer, and second oxide layer 1540 can be a low-k oxide layer (e.g., silicon oxide). The cyclic sol-gel process can be repeatedly performed until recess structures 601 are filled by the stack of first oxide layer 1440 and second oxide layer 1540 (shown in FIG. 16). In some embodiments, to provide a metal-rich top surface for second dielectric layer 140U (e.g., for increasing etching selectivity between second dielectric layer 140U and first dielectric layer 140L; discussed at operation 220), the last cycle of the cyclic sol-gel process can only include the first sol-gel process to form a top metal oxide layer 1440 as illustrated at FIG. 16.

Similar to the sol-gel process discussed with respect to FIG. 7 and/or FIG. 8, the cyclic sol-gel process performed with respect to FIGS. 14-16 can include performing an annealing process on substrate 102 to remove solvents from the coated first and second flowable dielectric materials to form first oxide layer 1440 and second oxide layer 1540 over one another. The annealing process for the cyclic sol-gel process (e.g., each of the first and second sol-gel processes) can be performed at a temperature from about 50° C. to about 250° C. or from about 80° C. to about 200° C. with a suitable ambient gas environment, such as nitrogen and oxygen. If the temperature of the annealing process is less than the above-noted lower limits, the annealing process may not remove the solvent from the first and second flowable dielectric materials. If the temperature of the annealing process is greater than the above-noted upper isolation structure 140 formed by method 200 may become porous; thus causing a leakage current in semiconductor device 100. Further, the annealing process can be performed with a suitable time duration from 30 seconds to about 180 seconds or from 60 seconds to about 120 seconds. If the time duration of the annealing process is less than the above-noted lower limits, the annealing process may not remove the solvent from the first and second flowable dielectric materials. If the time duration of the annealing process is greater than the above-noted upper limits, method 200 may not meet the manufacturing throughput requirement to fabricate semiconductor device 100, thus increasing the production cost of semiconductor device 100.

Similar to the sol-gel process discussed with respect to FIG. 7 and/or FIG. 8, first oxide layer 1440 formed by a cycle of the first sol-gel process can have a bottom thickness $d_{1440L}$ (shown in FIG. 14) outside recess structure 601 and a top thickness $d_{1440U}$ (shown in FIG. 14) over fin structure 108. Because the first sol-gel process can direct the first flowable dielectric material flowing towards recess structures 601, the resulting first oxide layer 1440's bottom thickness $d_{1440L}$ about 10 nm) can be greater than top thickness $d_{1440U}$ (e.g., about 5 nm). Similarly, second oxide layer 1540 formed by a single cycle of the second sol-gel process can have a bottom thickness $d_{1540L}$ (shown in FIG. 15) outside recess structure 601 and a top thickness $d_{1540U}$ (shown in FIG. 15) over fin structure 108. Because the second sol-gel process can direct the second flowable dielectric material flowing towards recess structures 601, the resulting second oxide layer 1540's bottom thickness $d_{1540L}$ (e.g., about 10 nm) can be greater than top thickness $d_{1540U}$ (e.g., about 5 mu). Because each cycle of the cyclic sol-gel process can direct the first and second flowable dielectric materials flowing towards recess structures 601, the resulting stack of first oxide layer 1440 and second oxide layer 1540 can be a seamless (e.g., without void structures) dielectric stack in recess structure 601.

Figure 17:
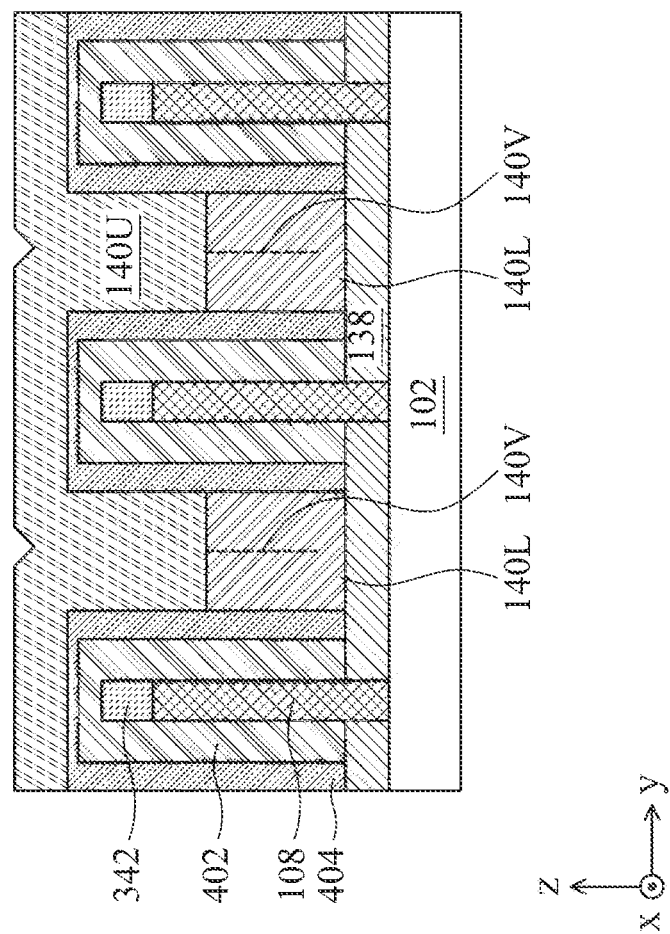

Referring to FIG. 17, in the laminate mode, operation 215 can further include (i) performing an annealing process to cross-link first oxide layers 1440 and second oxide layers 1540 of the structure of FIG. 16 to form second dielectric layer 140U (shown in FIG. 17) over first dielectric layer 140L and over fin structures 108, and (ii) planarizing, via a CMP process, FIG. 17's second dielectric layer 140U to form FIG. 13's second dielectric layer 140U with height $H_{140U}$ and be coplanar with hard mask layers 342. In some embodiments, the term "cross-linking a first and second materials" can refer to (i) forming a covalent bond between the first and the second materials, or (ii) blending the first and second materials. The annealing process for cross-linking first oxide layers 1440 and second oxide layers 1540 can include a rapid thermal annealing process and/or a furnace annealing process with suitable time durations. In some embodiments, the annealing process for cross-linking first oxide layers 1440 and second oxide layers 1540 can be a rapid thermal annealing process with a suitable time duration from about 10 seconds to about 30 seconds. In some embodiments, to provide a sufficient thermal energy to cross-link first oxide layers 1440 and second oxide layers 1540, the annealing process for cross-linking first oxide layers 1440 and second oxide layers 1540 can be a furnace annealing process with a time duration greater than the time duration of the annealing process (e.g., for removing the solvent from the coated flowable dielectric material) performed with respect to FIGS. 14-16. For example, the annealing process for cross-linking first oxide layers 1440 and second oxide layers 1540 can be a furnace annealing process with a time duration from 10 minutes to about 100 minutes or from 30 minutes to about 90 minutes. If the time duration of the furnace annealing process is less than the above-noted lower limits, the furnace annealing process may not cross-link first oxide layers 1440 and second oxide layers 1540. If the time duration of the furnace annealing process is greater than the above-noted upper limits, isolation structure 140 formed by method 200 may become porous, thus causing a leakage current in semiconductor device 100.

Further, the annealing process for cross-linking first oxide layers 1440 and second oxide layers 1540 can be performed at a temperature greater than the temperature of the annealing process performed with respect to FIGS. 14-16 to provide a sufficient thermal energy to cross-link first oxide layers 1440 and second oxide layers 1540. For example, the annealing process for cross-linking first oxide layers 1440 and second oxide layers 1540 can be performed at a temperature from about 550° C. to about 950° C., from about 600° C. to about 900° C., from about 700° C. to about 900° C., or from about 750 CC to about 900° C. with a suitable ambient gas environment, such as nitrogen and oxygen. If the temperature of the annealing process is less than the above-noted lower limits, the annealing process may not cross-link first oxide layers 1440 and second oxide layers 1540. If the temperature of the annealing process is greater than the above-noted upper limits, isolation structure 140 formed by method 200 may become porous, thus causing a leakage current in semiconductor device 100.

Figure 18:
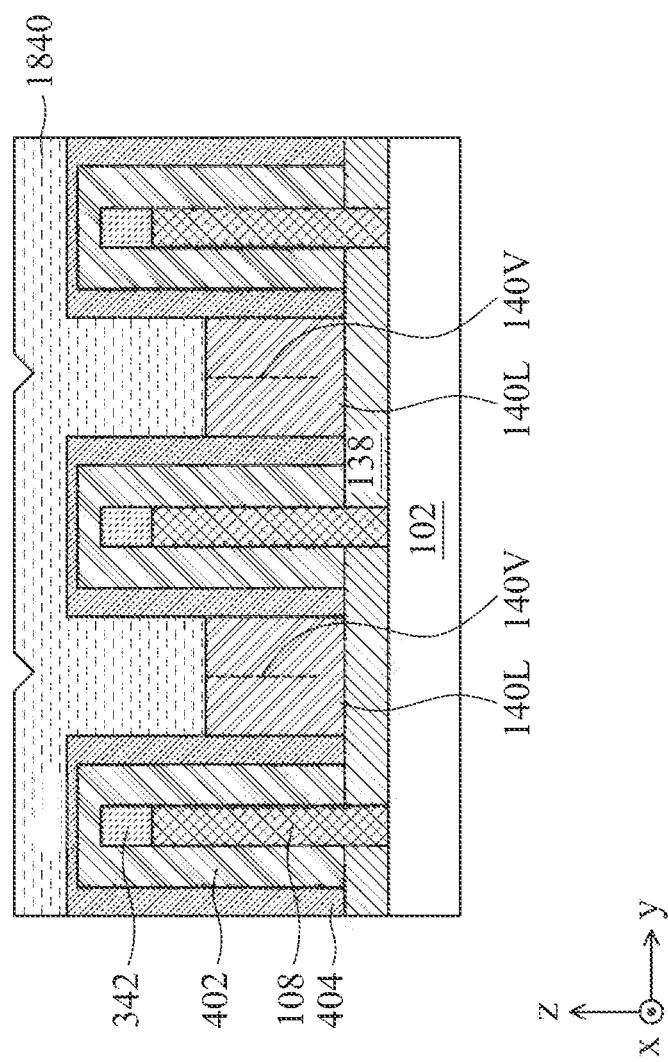
Figure 19:
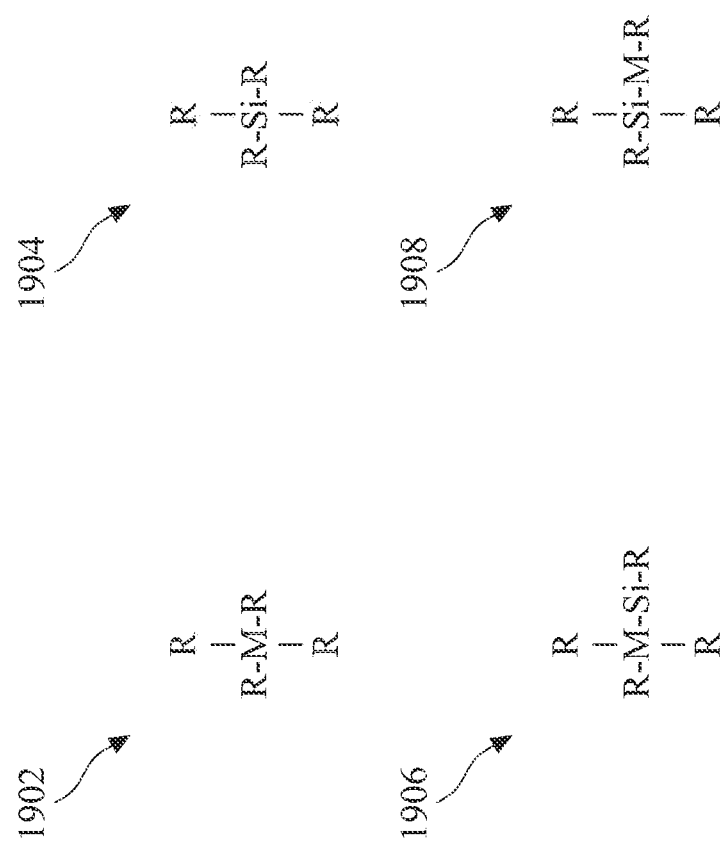
FIGS. 19 and 21 illustrate chemical formulas of an isolation structure of a semiconductor device at various stages of its fabrication, according to some embodiments.

Referring to FIGS. 18 and 19, in the hybrid mode and with reference to FIGS. 13 and 17-20, operation 215 can include performing a sol-gel process to spin-coat or dip-coat a flowable monomer material to form a metal-silicate layer 1840 (shown in FIG. 18) in recess structures 601 of FIG. 6. In some embodiments, the flowable monomer material can include a mixture of a metal-R monomer material 1902 (shown in FIG. 19) and a silicon-R monomer material 1904 (shown in FIG. 19). In some embodiments, the terms "—R" in FIGS. 18 and 20 can refer to a functional group that includes hydrocarbon or hydroxycarbanyl (e.g., $C_xH_y$ or $O-C_xH_y$). In some embodiments, metal-R monomer material 1902 can be $Zr-[O-CH_3]_4$. In some embodiments, silicon-R monomer material 1904 can be $Si-[O-CH_3]_4$. In some embodiments, the flowable monomer material can include both silicon and a metallic element, such as metal-Si—R or Si-metal-R monomers 1906 and 1908 (shown in FIG. 19). In some embodiments, monomer 1906 can be $Zr-[O-CH_3]_3Si[CH_3]_3$. In some embodiments, monomer 1908 can be $Si-[O-CH_3]_3Zr[CH_3]_3$. Because the sol-gel process can direct the flowable monomer material flowing towards recess structures 601, the resulting metal-silicate layer 1840 can be a seamless (e.g., without void structures) dielectric layer in recess structure 601.

Similar to the sol-gel process discussed with respect to FIG. 7 and/or FIG. 8, the sol-gel process performed with respect to FIG. 18 can include performing an annealing process on substrate 102 to remove solvents to enhance the hydroxylation reaction of coated flowable monomer materials to form metal-silicate layer 1840. The annealing process for the sol-gel process can be performed at a temperature from about 50° C. to about 250° C. or from about 80° C. to about 200° C. with a suitable ambient gas environment, such as nitrogen and oxygen. If the temperature of the annealing process is less than the above-noted lower limits, the annealing process may not remove the solvent from the flowable monomer material. If the temperature of the annealing process is greater than the above-noted upper limits, isolation structure 140 formed by method 200 may become porous, thus causing a leakage current in semiconductor device 100. Further, the annealing process can be performed with a suitable time duration from 30 seconds to about 180 seconds or from 60 seconds to about 120 seconds. If the time duration of the annealing process is less than the above-noted lower limits, the annealing process may not remove the solvent from the flowable monomer materials. If the time duration of the annealing process is greater than the above-noted upper limits, method 200 may not meet the manufacturing throughput requirement to fabricate semiconductor device 100, thus increasing the production cost of semiconductor device 100.

Figure 20:
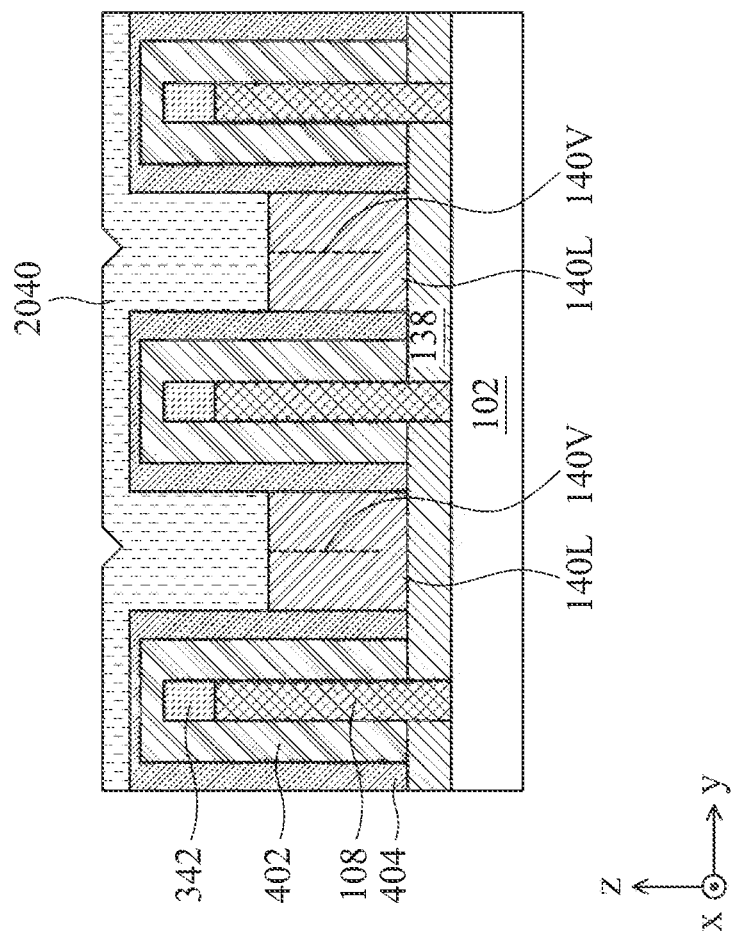
Figure 21:
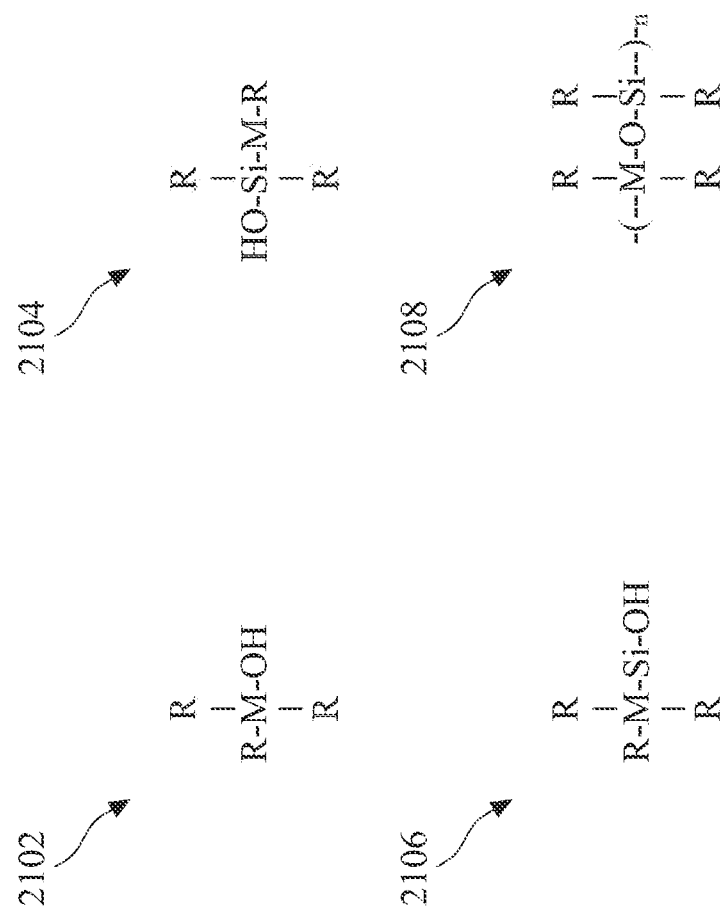

Referring to FIGS. 20 and 21, in the hybrid mode, operation 215 can further include performing a hydroxylation enhancement process on substrate 102 to increase hydroxyl groups in the flowable monomer material to form hydroxylation monomer layer 2040 (shown in FIG. 20) over first dielectric layer 1401, and over fin structures 108. In some embodiments, as shown in FIG. 21, hydroxylation monomer layer 2040 can include a hydroxyl-metal monomer 2102, a hydroxyl-silicon monomer 2104, or a hydroxyl-metal-silicon monomer 2106. The temperature of the hydroxylation enhancement process can be performed at a temperature greater than the temperature of the solvent-removal annealing process performed with respect to FIG. 18 to provide a sufficient thermal energy to increase hydroxyl groups in the flowable monomer material to form hydroxylation monomer layer 2040. For example; the annealing process for the hydroxylation enhancement process can be performed at a temperature from about 250° C. to about 600° C., from about 300° C. to about 600° C., from about 300° C. to about 550° C., or from about 300° C. to about 500° C. with a suitable ambient gas environment, such as nitrogen and oxygen. If the temperature of the hydroxylation enhancement process is less than the above-noted lower limits, the annealing process may not introduce hydroxyl metal-O—Si in the flowable monomer material to form hydroxylation monomer layer 2040. If the temperature of the hydroxylation process is greater than the above-noted upper limits, isolation structure 140 formed by method 200 may become porous, thus causing a leakage current in semiconductor device 100.

In some embodiments, the hydroxylation enhancement process for increasing hydroxyl groups in the flowable monomer material to form hydroxylation monomer layer 2040 can be a rapid thermal annealing process with a suitable time duration from about 10 seconds to about 30 seconds. In some embodiments, to provide a sufficient thermal energy to increase hydroxyl groups in the flowable monomer material to form hydroxylation monomer layer 2040, the hydroxylation enhancement process can be a furnace annealing process with a time duration greater than the time duration of the annealing process (e.g., for removing the solvent from the coated flowable dielectric material) performed with respect to FIG. 18. For example, the hydroxylation enhancement process can be a furnace annealing process with a time duration from 10 minutes to about 100 minutes or from 30 minutes to about 90 minutes. If the time duration of the furnace annealing process is less than the above-noted lower limits, the furnace annealing process may not increase hydroxyl groups in the flowable monomer material to form hydroxylation monomer layer 2040. If the time duration of the furnace annealing process is greater than the above-noted upper limits, isolation structure 140 formed by method 200 may become porous, thus causing a leakage current in semiconductor device 100.

In the hybrid mode, operation 215 can further include (i) performing an annealing process on the structure of FIG. 20 to cross-link hydroxylation monomer layer 2040 (e.g., cross-link one another of hydroxyl-metal monomer 2102, hydroxyl-silicon monomer 2104, and/or hydroxyl-metal-silicon monomer 2106 to form second dielectric layer 140U which chemical formula can be represented by polymer 2108) to form second dielectric layer 140U of FIG. 17 over first dielectric layer 140L and over fin structures 108, and (ii) planarizing, via a CMP process, FIG. 20's second dielectric layer 140U to form FIG. 13's second dielectric layer 140U with height, and be coplanar with hard mask layers 342. The annealing process for cross-linking hydroxylation monomer layer 2040 can include a rapid thermal annealing process and/or a furnace annealing process with suitable time durations. In some embodiments, the annealing process for cross-linking hydroxylation monomer layer 2040 can be a rapid thermal annealing process with a suitable time duration from about 10 seconds to about 30 seconds. In some embodiments, to provide a sufficient thermal energy to cross-link hydroxylation monomer layer 2040, the annealing process for cross-linking hydroxylation monomer layer 2040 can be a furnace annealing process with a time duration greater than the time duration of the furnace annealing process (e.g., for removing the solvent from the coated flowable dielectric material) performed with respect to FIG. 18. For example, the annealing process for cross-linking hydroxylation monomer layer 2040 can be a furnace annealing process with a time duration from 10 minutes to about 100 minutes or from 30 minutes to about 90 minutes. If the time duration of the furnace annealing process is less than the above-noted lower limits, the furnace annealing process may not cross-link hydroxylation monomer layer 2040. If the time duration of the furnace annealing process is greater than the above-noted upper limits, isolation structure 140 formed by method 200 may become porous, thus causing a leakage current in semiconductor device 100.

Further, the annealing process for cross-linking hydroxylation monomer layer 2040 can be performed at a temperature greater than the temperature of the annealing process performed with respect to FIG. 18 to provide a sufficient thermal energy to cross-link first hydroxylation monomer layer 2040. For example, the annealing process for cross-linking first hydroxylation monomer layer 2040 can be performed at a temperature from about 550° C. to about 950° C., from about 600° C. to about 900° C., from about 700° C. to about 900° C., or from about 750° C. to about 900° C. with a suitable ambient gas environment, such as nitrogen and oxygen. If the temperature of the annealing process is less than the above-noted lower limits, the annealing process may not cross-link hydroxylation monomer layer 2040. If the temperature of the annealing process is greater than the above-noted upper limits, isolation structure 140 formed by method 200 may become porous, thus causing a leakage current in semiconductor device 100.

Referring to FIG. 2, in operation 220, a gate structure is formed on the multiple fin structures, where the gate structure can be segmented by the second isolation structure. For example, as shown in FIG. 26 or 27, gate structure 110 can be formed over fin structures 108 and segmented by second dielectric layer 140L with reference to FIGS. 22-27.

Figure 22:
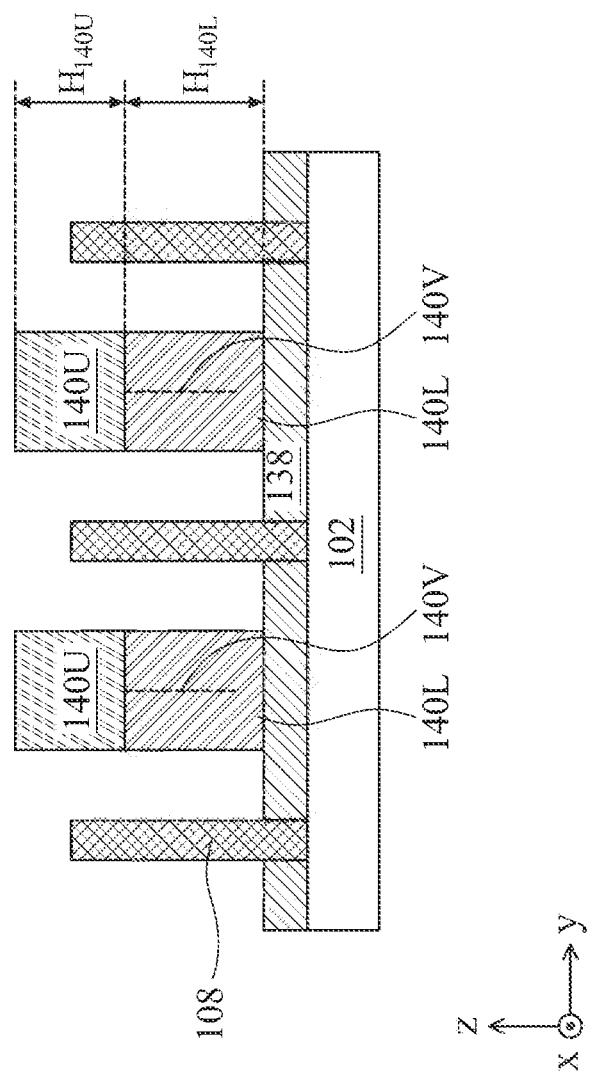
Figure 23:
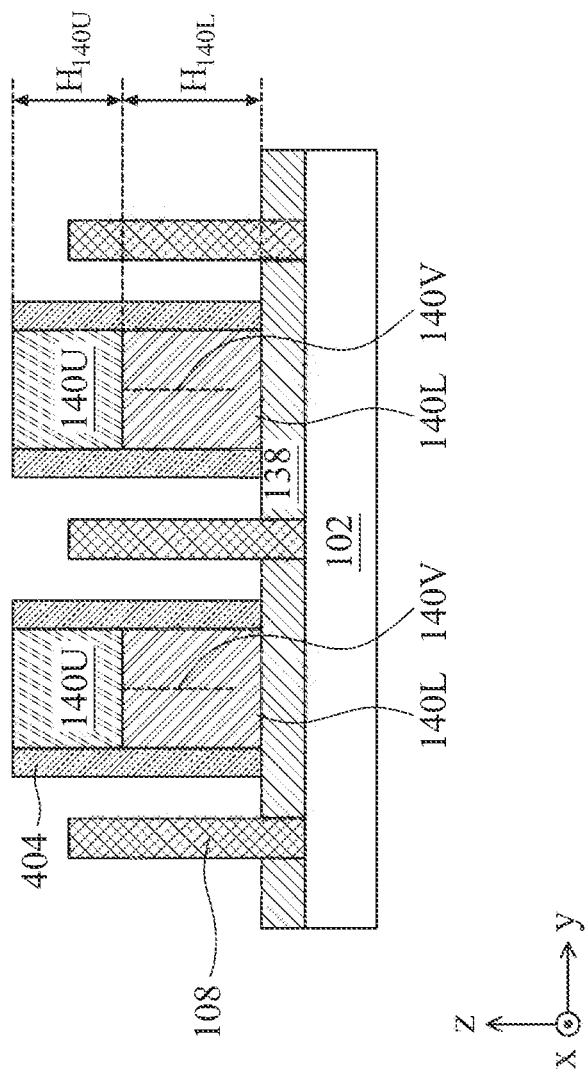

Referring to FIG. 22, operation 220 can begin with (i) forming a sacrificial gate structure (not shown in FIGS. 13 and 22) over FIG. 13's fin structures 108, over FIG. 13's first dielectric layers 140L, and over FIG. 13's second dielectric layer 140U, (ii) forming ILD layer 118 (not shown in FIGS. 13 and 22) coplanar with the sacrificial gate structure, (iii) removing the sacrificial gate structure to expose hard mask layers 342 and second dielectric layers 140L as illustrated in FIG. 13, (iv) removing, via an etching process, hard mask layers 342 from the structure of FIG. 13, and (v) removing, via another etching process, seed layer 402 and capping layer 404 from the structure of FIG. 13 to expose fin structures 108, first dielectric layer 140L, second dielectric layers 140U. The etching process of removing seed layer 402 and capping layer 404 can have a higher etching rate towards seed layer 402 and capping layer 404 and a lower etching rate towards fin structure 108. For example, fin structure 108, seed layer 402, and capping layer 404 can be made of silicon, silicon germanium, and silicon nitride, respectively, where the etching process can remove silicon germanium (e.g., seed layer 402) and silicon nitride (capping layer 404) at a greater etching rate and remove silicon (e.g., fin structure 108) at a lower etching rate. In some embodiments, the etching process of removing seed layer 402 can selectively remove seed layer 402 over capping layer 404 and over fin structures 108. Accordingly, as shown in FIG. 23, after removing seed layer 402, capping layer 404 can remain over sidewalls of first dielectric layer 140L and second dielectric layer 140U.

Figure 24:
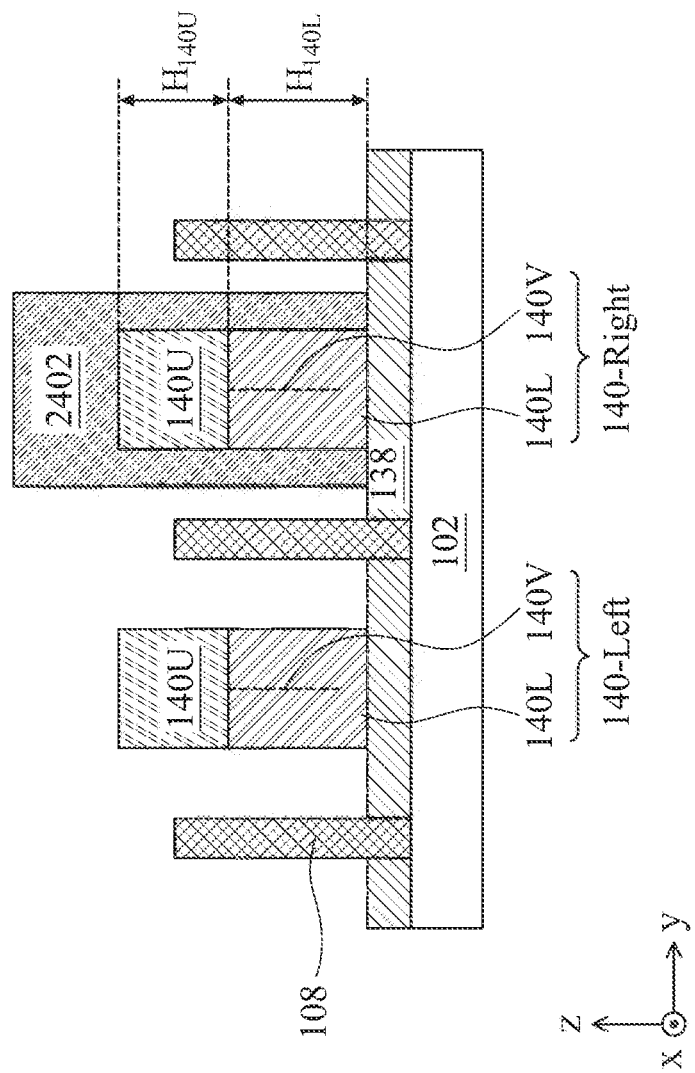
Figure 25:
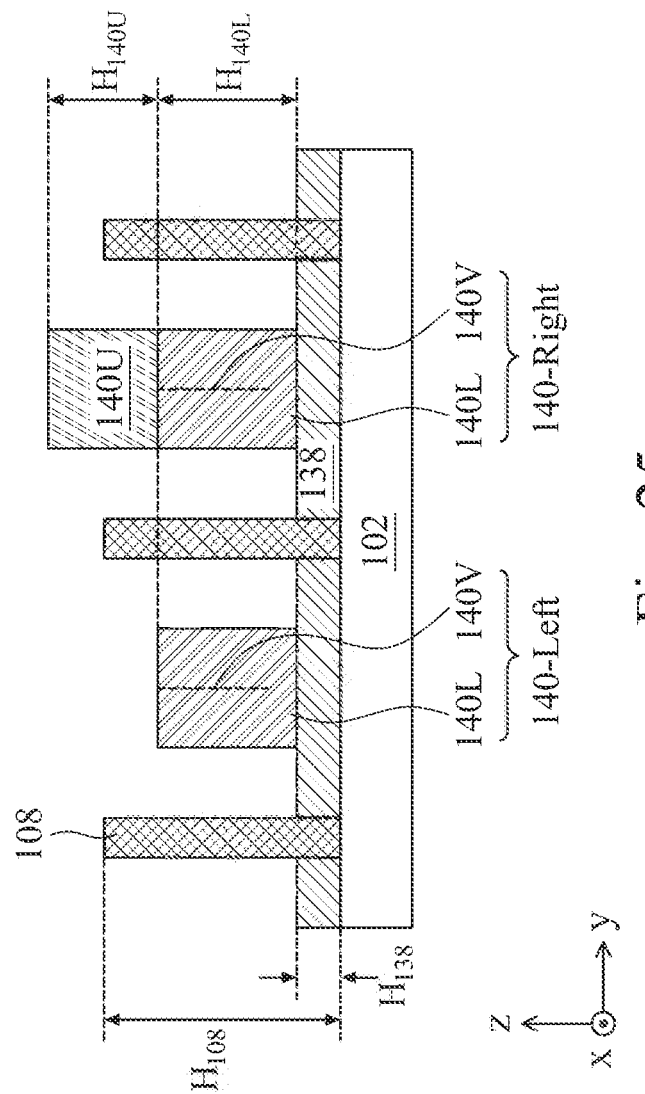

Referring to FIGS. 24 and 25, operation 220 can further include (i) forming, via a lithography process, a hard mask layer 2402 (shown in FIG. 24) to mask one of the first dielectric layer 140L and second dielectric layer 140U (e.g., masking isolation structure 140-Right shown in FIG. 24) and expose another of the first dielectric layer 140L and second dielectric layer 140U (e.g., exposing isolation structure 140-Left shown in FIG. 24), and (ii) removing, via a selective etching process, isolation structure 140-Left's second dielectric layer 140U over isolation structure 140-Left's first dielectric layer 140L (shown in FIG. 25). Accordingly, after the above-noted selective etching process, isolation structure 140-Left's top surface can be vertically (e.g., in the z-direction) lower than adjacent fin structures 108's top surfaces (e.g., the sum of first dielectric layer 140L's height $H_{140L}$ and STI region 138's height $H_{138}$ can be less than fin structure 108's height $H_{108}$.) Further, after the above-noted selective etching process, isolation structure 140-Right's top surface can be vertically (e.g., in the z-direction) higher than adjacent fin structures 108's top surfaces (e.g., the sum of first dielectric layer 140L's height $H_{140L}$, second dielectric layer 140U's height $H_{140U}$, and STI region 138's height $H_{138}$ can be greater than fin structure 108's height $H_{108}$).

Figure 26:
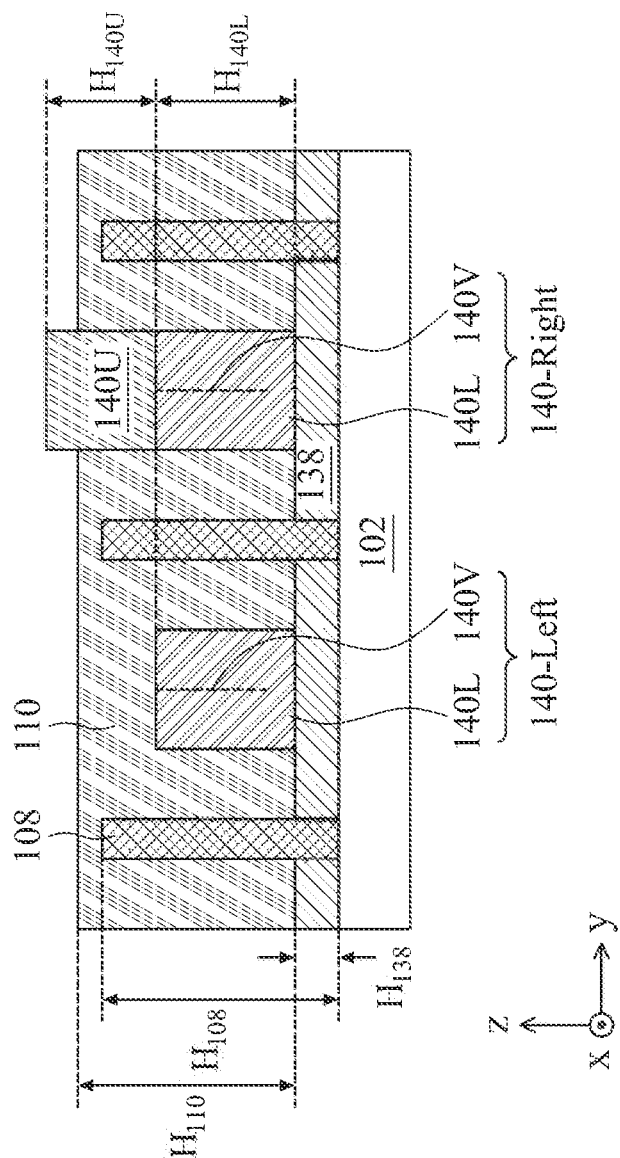
Figure 27:
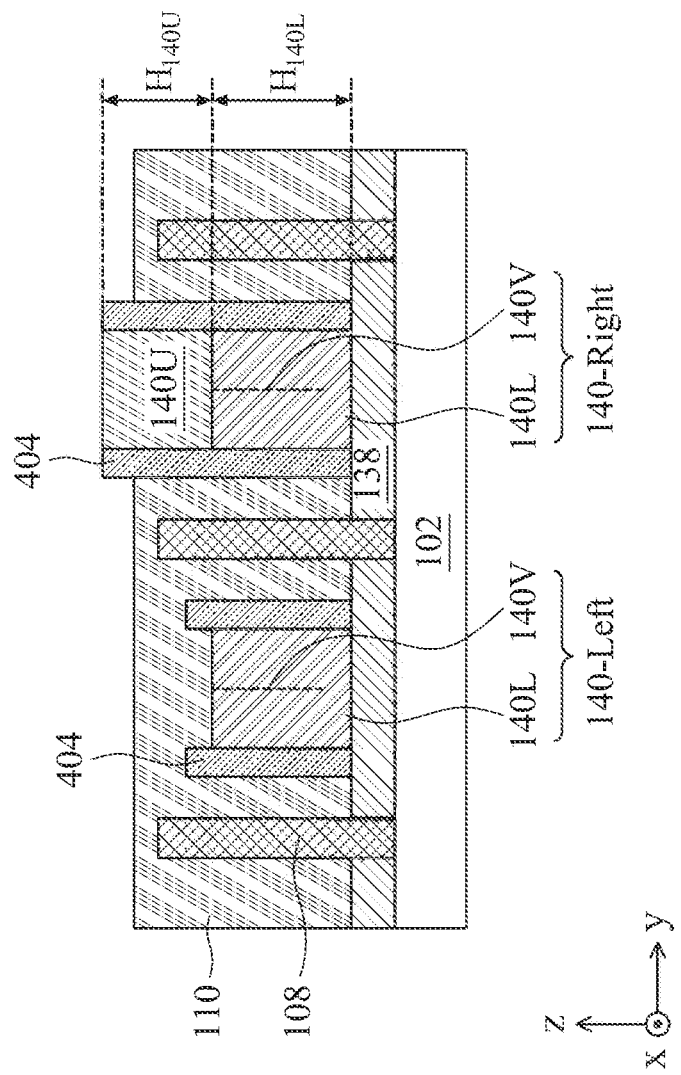

Referring to FIG. 26, operation 220 can further include (i) depositing a gate dielectric material over the structure of FIG. 25, (ii) depositing a gate electrode material over the gate dielectric material, and (iii) etching back, via a CMP process and an etching process, the deposited gate dielectric material and the gate electrode material to form gate structure 110 with height $H_{110}$. As shown in FIG. 26, after forming gate structure 110, isolation structure 140-Left's top surface can be vertically (e.g., in the z-direction) lower than gate structure 110 (e.g., first dielectric layer 140L's height $H_{140L}$ can be less than gate structure 110's height $H_{110}$). Further, after forming gate structure 110, isolation structure 140-Right's top surface can be vertically (e.g., in the z-direction) higher than gate structure 110 (e.g., the sum of first dielectric layer 140L's height $H_{140L}$, second dielectric layer 140U's height $H_{140U}$ can be greater than gate structure 110's height $H_{110}$). In some embodiments, the previously discussed operations of FIGS. 24-26 can be performed on the structure of FIG. 23 to result in the structure of FIG. 27. In some embodiments, as shown in FIG. 27, isolation structure 140-Right's capping layer 404 can be formed through gate structure 110.

The present disclosures provides an exemplary isolation structure and a method for forming the same. The isolation structure can be disposed between two laterally adjacent fin structures and to isolate metal lines on the two laterally adjacent fin structures. The method for forming the isolation structure can include depositing a first layer of dielectric material between the two adjacent fin structures. The method for forming the isolation structure can further include performing a spin-coating process to coat a flowable oxide material over the first layer of dielectric material. The flowable oxide material can include a flowable metal oxide material, a flowable silicon oxide material, a carbon-silicon monomer material, or a carbon-silicon-metal monomer material. The process of spin-coating can further include annealing the coated flowable oxide material to form a second layer of dielectric material that contains silicon-metal-oxide. By, incorporating silicon into the second layer of dielectric material, the second layer of dielectric material's dielectric constant to be reduced, thus reducing the parasitic capacitance coupling between the two laterally adjacent fin structures. Further, since the process of spin-coating can fill in the space between two laterally adjacent fin structure, the second layer of dielectric material can be a seamless layer free from voids (e.g., the second layer of dielectric material does not have voids). A benefit of the seamless second layer of dielectric material of the isolation structure, among others, is to provide a sufficient isolation and a reduced parasitic capacitance between the adjacent fin structures, thus improving the yield and performance of the ICs.

In some embodiments, a semiconductor structure can include a substrate, first and second fin structures formed over the substrate, and an isolation structure between the first and second fin structures. The isolation structure can include a lower portion and an upper portion. The lower portion of the isolation structure can include a metal-free dielectric material. The upper portion of the isolation structure can include a metallic element and silicon.

In some embodiments, a method can include forming a fin structure over a substrate, forming a first layer of dielectric material adjacent to the fin structure, forming a second layer of dielectric material with a first thickness over the fin structure and a second thickness over the first layer of dielectric material, and replacing the second layer of dielectric material with a third layer of dielectric material. The first layer of dielectric material can include a void.

In some embodiments, a method can include forming first and second fin structures over a substrate, forming a first layer of dielectric material between the first and second fin structures, forming a second layer of dielectric material with a first thickness over the first and second fin structures and a second thickness greater than the first thickness over the first layer of dielectric material, and replacing the second layer of dielectric material with a third layer of dielectric material. The first layer of dielectric material can include a void. The second layer of dielectric material can be seamless.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
  forming a fin structure over a substrate, wherein a hard mask layer is disposed on a top surface of the fin structure;
  forming a seed layer surrounding the fin structure, comprising:
    depositing the seed layer over the fin structure; and
    planarizing the seed layer to be substantially coplanar with a top surface of the hard mask layer;
  forming a capping layer surrounding the seed layer;

forming a layer of a first dielectric material with a first thickness over the fin structure and in contact with the capping layer;

recessing the first dielectric material to a depth below the top surface of the fin structure to form a recess; and forming, within the recess, a layer of a second dielectric material on the first dielectric material.

2. The method of claim 1, wherein forming the layer of the second dielectric material comprises spin-coating a flowable dielectric material over the layer of the first dielectric material and the fin structure.

3. The method of claim 2, wherein spin-coating the flowable dielectric material comprises:

performing a first annealing process at a first temperature to remove a solvent from the flowable dielectric material; and planarizing the flowable dielectric material to be substantially coplanar with the top surface of the hard mask layer.

4. The method of claim 2, wherein spin-coating the flowable dielectric material comprises:

spin-coating the flowable dielectric material over the layer of the first dielectric material; and spin-coating another flowable dielectric material over the flowable dielectric material.

5. The method of claim 3, wherein spin-coating the flowable dielectric material comprises:

performing an implantation process to dope the annealed flowable dielectric material with dopants; and performing a second annealing process at a second temperature greater than the first temperature to activate the dopants in the flowable dielectric material.

6. The method of claim 3, wherein spin-coating the flowable dielectric material comprises:

performing the first annealing process with a first time duration;

performing a doping process to dope the annealed flowable dielectric material; and performing a second annealing process with a second time duration greater than the first time duration to crystalize the doped flowable dielectric material.

7. A method, comprising:

forming first and second fin structures over a substrate, wherein a hard mask layer is disposed on a top surface of the first fin structure and a top surface of the second fin structure;

forming a seed layer surrounding the first fin structure and the second fin structure;

forming a capping layer surrounding the seed layer;

forming a layer of a first dielectric material between the first and second fin structures;

forming a layer of a second dielectric material over the layer of the first dielectric material; and co-planarizing the layer of second dielectric material with top surfaces of the hard mask layer and the seed layer.

8. The method of claim 7, wherein forming the layer of the second dielectric material comprises spin-coating a flowable dielectric material over the layer of the first dielectric material and the first and second fin structures.

9. The method of claim 8, wherein spin-coating the flowable dielectric material comprises planarizing the flowable dielectric material to be substantially coplanar with a top surface of the hard mask layer.

10. The method of claim 8, wherein spin-coating the flowable dielectric material comprises:

spin-coating the flowable dielectric material over the layer of the first dielectric material; and spin-coating another flowable dielectric material over the flowable dielectric material.

11. The method of claim 8, wherein spin-coating the flowable dielectric material comprises:

performing a first annealing process at a first temperature to remove a solvent from the flowable dielectric material;

performing an implantation process to dope the annealed flowable dielectric material; and performing a second annealing process at a second temperature greater than the first annealing temperature to activate the doped flowable dielectric material.

12. The method of claim 8, wherein spin-coating the flowable dielectric material comprises:

performing a first annealing process with a first time duration to remove a solvent from the flowable dielectric material;

performing a doping process to dope the annealed flowable dielectric material; and performing a second annealing process with a second time duration greater than the first time duration to crystalize the doped flowable dielectric material.

13. A method comprising:

forming first and second fin structures over a substrate; and forming an isolation structure between the first and second fin structures, wherein forming the isolation structure comprises:

forming a lower portion comprising a dielectric material;

forming an upper portion comprising a flowable monomer layer; and annealing the flowable monomer layer to form a metal-silicate layer.

14. The method of claim 13, further comprising forming a layer of a second dielectric material over the first and second fin structures.

15. The method of claim 14, further comprising annealing the layer of the second dielectric material.

16. The method of claim 13, wherein forming the isolation structure comprises:

forming the dielectric material comprising silicon with an atomic concentration less than about 50%; and forming the upper portion of the isolation structure comprising oxygen.

17. The method of claim 13, further comprising forming the first fin structure with a height less than a separation between the substrate and a top surface of the isolation structure.

18. The method of claim 13, further comprising forming the first fin structure with a height greater than a separation between a bottom surface of the upper portion of the isolation structure and the substrate.

19. The method of claim 13, further comprising forming another isolation structure between the first fin structure and the isolation structure, wherein a height of the isolation structure is greater than another height of the another isolation structure.

20. The method of claim 3, wherein the first annealing is performed in a nitrogen or oxygen environment.

* * * * *